(12) United States Patent
Cho et al.

(10) Patent No.: US 11,545,650 B2
(45) Date of Patent: Jan. 3, 2023

(54) DISPLAY DEVICE

(71) Applicant: SAMSUNG DISPLAY CO., LTD., Yongin-si (KR)

(72) Inventors: Sung Ho Cho, Yongin-si (KR); Tae Ik Kim, Asan-si (KR); Hyun Sik Park, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 175 days.

(21) Appl. No.: 17/146,074

(22) Filed: Jan. 11, 2021

(65) Prior Publication Data

US 2021/0288293 A1 Sep. 16, 2021

(30) Foreign Application Priority Data

Mar. 11, 2020 (KR) ........................ 10-2020-0030182

(51) Int. Cl.
  *G06F 3/041* (2006.01)
  *H01L 51/52* (2006.01)
  (Continued)

(52) U.S. Cl.
  CPC ........ *H01L 51/5281* (2013.01); *G06F 3/0412* (2013.01); *G06F 3/0445* (2019.05);
  (Continued)

(58) Field of Classification Search
  CPC .... G02F 1/1333; G02F 1/1335; G02F 1/1339; G02F 1/1343; G02F 1/13312;
  (Continued)

(56) References Cited

U.S. PATENT DOCUMENTS

2011/0169720 A1* 7/2011 Hwang ............... H01L 27/3258
   345/76
2013/0258234 A1* 10/2013 Park .................. G02F 1/133528
   349/58

(Continued)

FOREIGN PATENT DOCUMENTS

CN 108885376 11/2018
KR 10-1429942 8/2014
   (Continued)

*Primary Examiner* — Olga V Merkoulova
(74) *Attorney, Agent, or Firm* — F. Chau & Associates, LLC

(57) ABSTRACT

A display device includes a first substrate, a second substrate that faces the first substrate, an active element layer disposed on a first surface of the first substrate that faces the second substrate and includes a first through-hole that penetrates therethrough in a thickness direction, and an anti-reflection member disposed on a second surface of the second substrate that faces the first substrate, overlaps the first through-hole, and is spaced apart from the first through-hole. The anti-reflection member includes a first refractive layer disposed on a second surface of the second substrate and that has a refractive index greater than a refractive index of the second substrate, and a second refractive layer disposed on the first refractive layer and that has a refractive index less than the refractive index of the first refractive layer.

20 Claims, 24 Drawing Sheets

(51) Int. Cl.
*G06F 3/044* (2006.01)
*H01L 27/32* (2006.01)

(52) U.S. Cl.
CPC ...... *H01L 27/3244* (2013.01); *H01L 51/5275* (2013.01); *G06F 2203/04111* (2013.01)

(58) Field of Classification Search
CPC ........... G02F 1/133331; G02F 1/13338; G02F 1/133528; G02F 1/134309; G02F 1/13439; G06F 3/041; G06F 3/044; G06F 3/0412; G06F 3/0443; G06F 3/0446; G06F 3/0448; H01L 27/32; H05B 33/02; H05B 33/04; H05B 33/26; H05B 33/28
See application file for complete search history.

(56) References Cited

U.S. PATENT DOCUMENTS

| | | | |
|---|---|---|---|
| 2018/0159075 A1* | 6/2018 | Kim | H01L 27/1248 |
| 2019/0123066 A1* | 4/2019 | Zhan | H01L 27/1218 |
| 2020/0058728 A1* | 2/2020 | Song | H01L 27/3265 |
| 2020/0083475 A1* | 3/2020 | Kang | H01L 27/32 |
| 2020/0106042 A1* | 4/2020 | Won | H01L 51/5246 |
| 2020/0135800 A1* | 4/2020 | Seo | H01L 51/5246 |
| 2020/0236259 A1* | 7/2020 | Nakamura | G02F 1/133512 |
| 2021/0111367 A1 | 4/2021 | Choi et al. | |
| 2021/0263363 A1* | 8/2021 | Horie | G02F 1/13439 |
| 2021/0408433 A1* | 12/2021 | Kim | H01L 27/3225 |

FOREIGN PATENT DOCUMENTS

| | | |
|---|---|---|
| KR | 10-1826849 | 2/2018 |
| KR | 10-1915334 | 10/2018 |
| KR | 20210044943 | 4/2021 |

\* cited by examiner

10: 100, ATL, SL, AR, 190

HLE: HLE_OP, HLE_TH1, HLE_TH2, HLE_TH3

ATL: 110, 121, 122, 123, 124, 126, 130, 140, 150, 160, 170, 180

HLE: HLE_OP, HLE_TH1, HLE_TH2, HLE_TH3

HLE: HLE_OP, HLE_TH1, HLE_TH2, HLE_TH3

HLE: HLE_OP, HLE_TH1, HLE_TH2, HLE_TH3

DISPLAY DEVICE

CROSS REFERENCE TO RELATED APPLICATIONS

This application claims priority under 35 U.S.C. § 119 from, and the benefit of, Korean Patent Application No. 10-2020-0030182, filed on Mar. 11, 2020 in the Korean Intellectual Property Office, the contents of which are herein incorporated by reference in their entirety.

BACKGROUND

1. Technical Field

Embodiments of the present disclosure are directed to a display device.

2. Discussion of the Related Art

Electronic devices that provide images to a user, such as a smart phone, a tablet PC, a digital camera, a laptop computer, a navigation device or a smart TV, include a display device that displays images.

A display device includes a display panel and elements for driving the display panel. Recently, elements that achieve a variety of other features in addition to displaying images are also being incorporated into display devices. A smart phone equipped with an optical element such as a camera or an infrared sensor an example.

For such an optical element to receive light, a display device may include an optical hole. To increase the transmittance of an optical hole, some elements of the display device are physically removed.

SUMMARY

Embodiments of the present disclosure provide a display device that can reduce deviations of light received by an optical element and can prevent image deterioration to light reflected by a camera lens.

An embodiment of a display device includes a first substrate, a second substrate that faces the first substrate, an active element layer disposed on a first surface of the first substrate that faces the second substrate and that includes a first through-hole that penetrates therethrough in a thickness direction, and an anti-reflection member disposed on a second surface of the second substrate that faces the first substrate, overlaps the first through-hole, and is spaced apart from the first through-hole. The anti-reflection member comprises a first refractive layer disposed on the second surface of the second substrate and that has a refractive index greater than a refractive index of the second substrate, and a second refractive layer disposed on the first refractive layer and that has a refractive index less than the refractive index of the first refractive layer.

An embodiment of a display device includes a display panel that includes a first substrate, a second substrate that faces the first substrate, an active element layer disposed on the first substrate, and an anti-reflection member disposed on the second substrate, a hole area formed in a display area of the display panel; a polarizer disposed on the display panel, and a window member disposed on the polarizer and that includes a window substrate and a print layer disposed on the window substrate. The hole area comprises a first through-hole that penetrates the active element layer in a thickness direction, a second through-hole that overlaps the first through-hole and penetrates the polarizer in the thickness direction, and an optical hole surrounded by the print layer. The optical hole overlaps the first through-hole and the second through-hole, and the anti-reflection member is spaced apart from the first through-hole and overlaps the first through-hole and the second through-hole.

An embodiment of a display device includes a first substrate; a second substrate that faces the first substrate; an active element layer disposed on a first surface of the first substrate that faces the second substrate; a first through-hole that penetrates the in a thickness direction; and an anti-reflection member disposed on one or both of the first substrate or the second substrate, wherein the anti-reflection member overlaps the first through-hole. The anti-reflection member includes a first refractive layer disposed on the first substrate or the second substrate and that has a refractive index greater than a refractive index of first substrate or the second substrate, and a second refractive layer disposed on the first refractive layer and that has a refractive index less than the refractive index of the first refractive layer. The first refractive layer is disposed between the second refractive layer and the first substrate or the second substrate.

According to exemplary embodiments of the present disclosure, a display device can reduce deviations of transmittance of light received by an optical element and can prevent deterioration of an image due to light reflected by a camera lens.

DETAILED DESCRIPTION OF EXEMPLARY EMBODIMENTS

Embodiments of the present disclosure will now be described more fully hereinafter with reference to the accompanying drawings, in which exemplary embodiments of the disclosure are shown. Embodiments of this disclosure may, however, take different forms and should not be construed as limited to exemplary embodiments set forth herein. Rather, exemplary embodiments are provided so that this disclosure will be thorough and complete, and will filly convey the scope of the disclosure to those skilled in the art.

It will also be understood that when a layer is referred to as being "on" another layer or substrate, it can be directly on the other layer or substrate, or intervening layers may also be present. The same reference numbers may indicate the same components throughout the specification. In the attached figures, the thickness of layers and regions may be exaggerated for clarity.

Hereinafter, exemplary embodiments of the present disclosure will be described with reference to the accompanying drawings.

Figure 1:
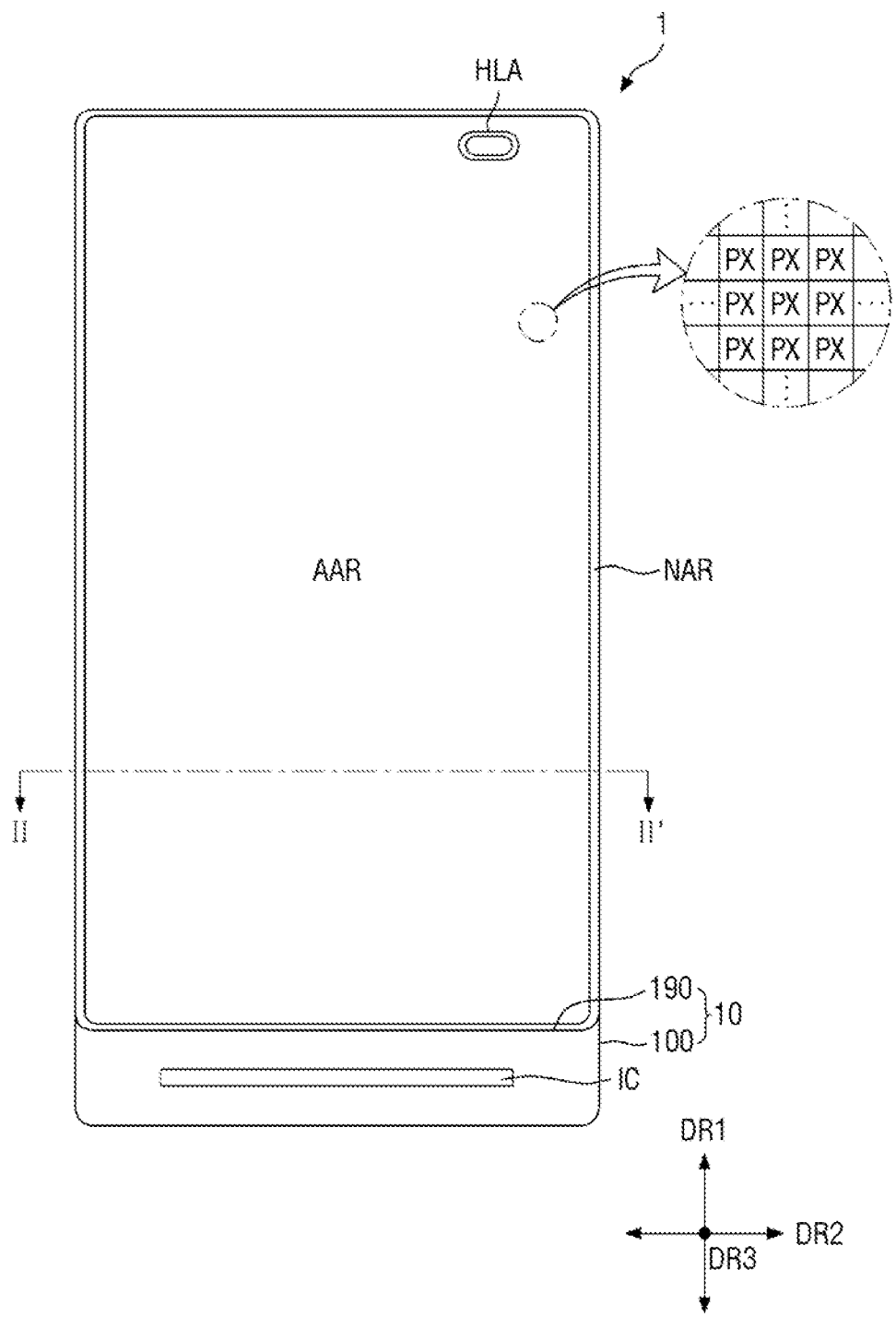
FIG. 1 is a plan view of a display device according to an exemplary embodiment of the present disclosure.
Figure 2:
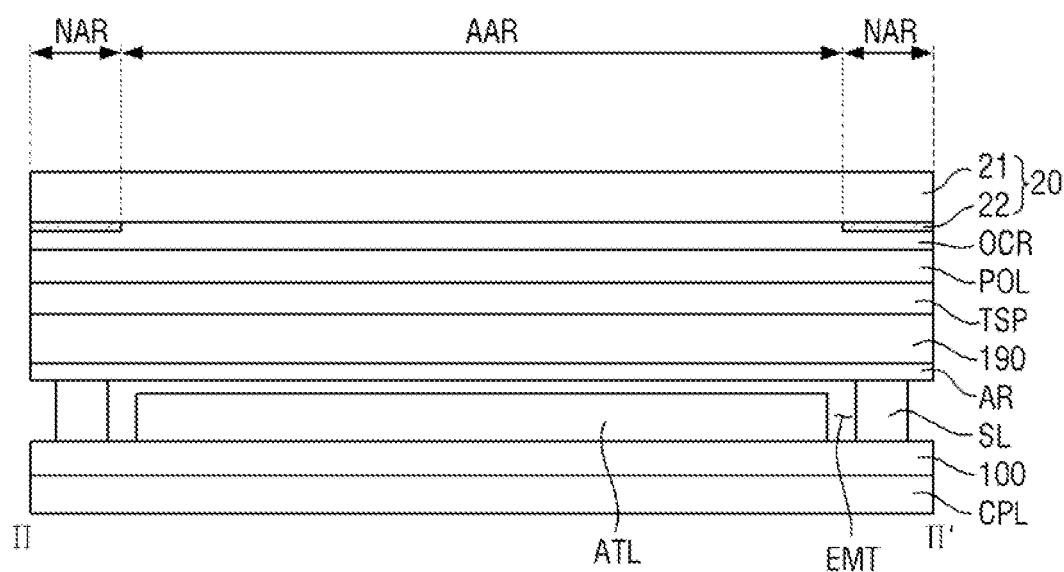
FIG. 2 is a cross-sectional view taken along line II-II' in FIG. 1.
Figure 2:
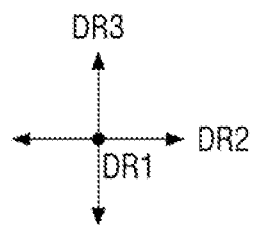

FIG. 1 is a plan view of a display device 1 according to an exemplary embodiment of the present disclosure. FIG. 2 is a cross-sectional view taken along line II-II' in FIG. 1. FIG. 2 is a cross-sectional view of a display device according to an exemplary embodiment of the present disclosure.

In the following descriptions, the first direction DR1 and the second direction DR2 cross each other, for example, the first direction DR1 is perpendicular to the second direction DR2 when viewed from above. The third direction DR3 crosses the plane defined by the first direction DR1 and the second direction DR2 for example, the third direction DR3 is normal to plane defined by the first direction DR1 and the second direction DR2. In the drawings, the first direction DR1 refers to a vertical direction of a display device 1, the second direction DR2 refers to a horizontal direction of the display device 1, and the third direction DR3 refers to a thickness direction of the display device 1.

Referring to FIGS. 1 and 2, the display device 1 can display a moving image or a still image. The images are displayed on one side in the third direction DR3, such as in a top-emission light-emitting display device. It is, however, to be understood that embodiments of the present disclosure are not limited thereto.

The display device 1 may be any electronic device that includes a display screen. The display device 1 may also be any portable electronic device that includes a display screen, such as a mobile phone, a smart phone, a tablet personal computer (PC), an electronic watch, a smart watch, a watch phone, a mobile communications terminal, an electronic notebook, an electronic book, a portable multimedia player (PMP), a navigation device, a game console or a digital camera, as well as a television set, a laptop computer, a monitor, an electronic billboard, or an Internet of Things device, etc.

According to an embodiment, the display device 1 includes an active area AAR and a non-active area NAR. In the display device 1, a display area is an area where images are displayed while a non-display area is an area where no image is displayed. The display area is in the active area AAR. When the display device 1 has touch features, a touch area where a touch input can be sensed is also included in the active area AAR. The display area and the touch area may overlap each other. In the active area AAR, images are displayed and a touch input is sensed.

Figure 6:
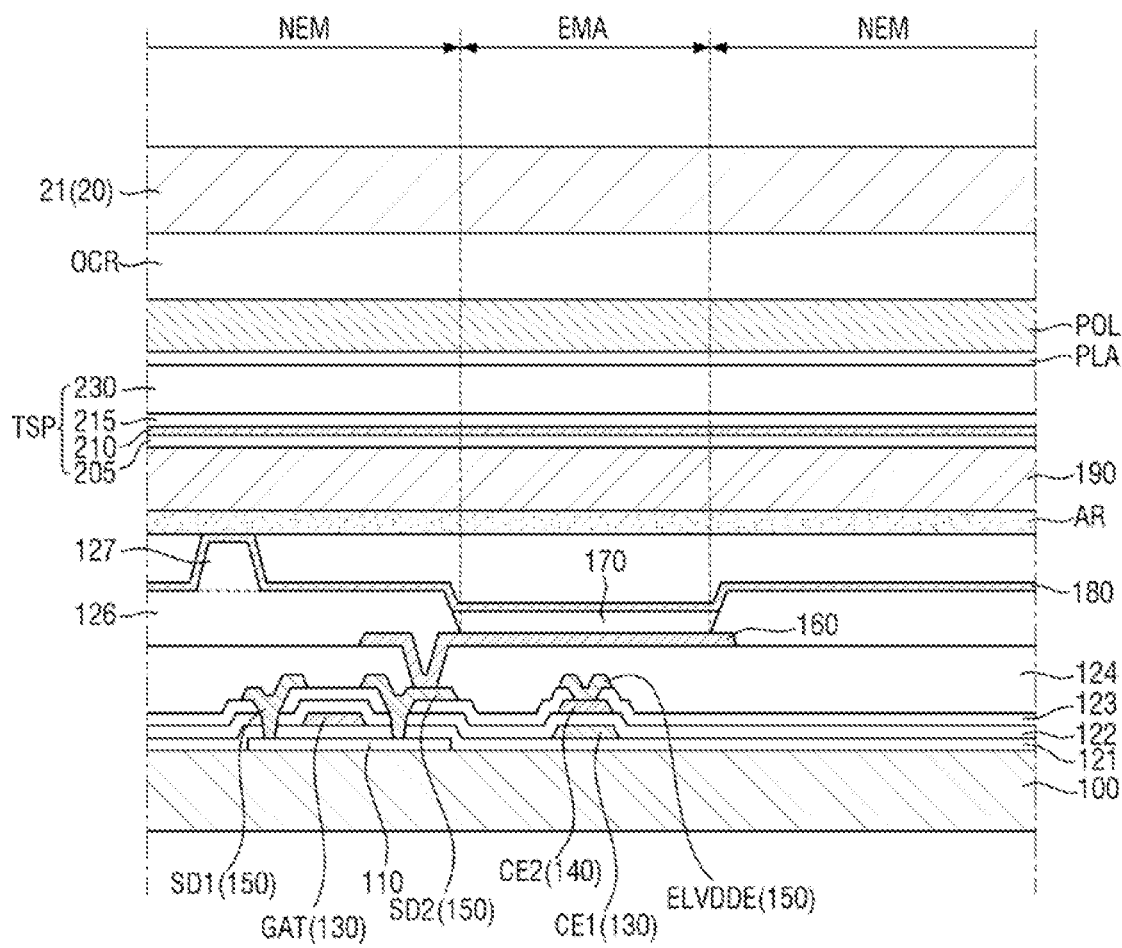
FIG. 6 is a cross-sectional view of a pixel of a display device according to an exemplary embodiment of the present disclosure.

According to an embodiment, the active area AAR includes a plurality of pixels PX. The plurality of pixels PX are arranged in a matrix. The shape of each pixel PX may be, but is not limited to, a rectangle or a square when viewed from above, i.e., in a plan view. For example, each of the pixels PX may have a diamond shape that has sides inclined with respect to the first direction DR1. Each of the pixels PX includes an emission area EMA and a non-emission area NEA, as shown in FIG. 6.

According to an embodiment, the non-active area NAR is disposed around the active area AAR. The non-active area NAR is a bezel area. The non-active area NAR overlaps a print layer 22 of a window member 20 that is described below with reference to FIG. 2.

According to an embodiment, the non-active area NAR surrounds all sides of the active area AAR. It is, however, to be understood that embodiments of the present disclosure are not limited thereto. For example, in other embodiments, the non-active area NAR is not disposed near an upper side of the active area AAR.

According to an embodiment, in the non-active area NAR, signal lines that transmit signals to the active area AAR, such as the display area or touch area, or driving circuits are disposed. According to an exemplary embodiment of the present disclosure, a driver chip IC is disposed in the non-active area NAR. The driver chip IC includes an integrated circuit that drives the display panel 10. The integrated circuit includes an integrated circuit for display and/or an integrated circuit for a touch member TSP. The driver chip IC can be mounted directly on the area of the first substrate 100 that protrudes from the second substrate 190.

According to an embodiment, the display device 1 further includes a hole area HLA that includes at least one hole HLE in the active area AAR. The hole area HLA will be described in more detail below.

FIG. 2 is a cross-sectional view taken along line II-II' in FIG. 1. [=Hereinafter, the cross-sectional structure of the display device 1 will be described with reference to FIGS. 1 and 2.

According to an embodiment, the display device 1 includes a display panel 10 that provides a display screen, a touch member TSP, a polarizer POL, a window member 20, and a cover panel CPL disposed under the display panel 10.

Examples of the display panel 10 include an organic light-emitting display panel, a micro LED display panel, a nano LED display panel, a quantum-dot display panel, a liquid-crystal display panel, a plasma display panel, a field emission display panel, an electrophoretic display panel, or an electrowetting display panel, etc In the following description, an organic light-emitting display panel is used as an example of the display panel 10, but embodiments of the present disclosure are not limited thereto. Any other type of display panel can be used as long as technical ideas of embodiments of the present disclosure can be equally applied.

According to an embodiment, the display panel 10 includes a first substrate 100, a second substrate 190 that faces the first substrate 100, an active element layer ATL and a sealing member SL disposed on the first substrate, and an anti-reflection member AR disposed on the active element layer ATL and sealing member SL and under the second substrate 190.

According to an embodiment, the first substrate 100 supports the active element layer ATL disposed thereon. The first substrate 100 is generally transparent and has a high light transmittance. The first substrate 100 may include, but is not limited to, an inorganic material such as glass or quartz. The inorganic material may include, but is not limited to, silicon oxide ($SiO_2$). It is, however, to be understood that embodiments of the present disclosure are not limited thereto. The first substrate 100 may be a transparent plate or a transparent film.

According to an embodiment, the second substrate 190 is disposed so that it faces the first substrate 100 and is spaced apart from the first substrate 100. The second substrate 190 protects the active element layer ATL from outside moisture and air. The second substrate 190 is generally transparent and has a high light transmittance. The second substrate 190 may include, but is not limited to, an inorganic material such as glass or quartz. The inorganic material may include, but is not limited to, silicon oxide ($SiO_2$). It is, however, to be understood that embodiments of the present disclosure are not limited thereto. The second substrate 190 may be a transparent plate or a transparent film.

According to an embodiment, the active element layer ATL is disposed between the first substrate 100 and the second substrate 190. The active element layer ATL is disposed on an upper or first surface of the first substrate 100. The active element layer ATL includes a light-emitting element and a thin-film transistor that drives it. It is, however, to be understood that embodiments of the present disclosure are not limited thereto. The active device layer ATL is spaced apart from the second substrate 190 above it. The active element layer ATL will be described in detail below.

According to an embodiment, the anti-reflection member AR is disposed between the first substrate 100 and the second substrate 190. The anti-reflection member AR is disposed on the lower or second surface of the second substrate 190. The lower surface of the second substrate 190 faces the upper surface of the first substrate 100. The anti-reflection member AR is disposed at least in the hole area HLA. The anti-reflection member AR may be disposed not only in the hole area HLA but also in the whole surface of the active area AAR, and may be disposed also in the non-active area NAR that surrounds the active area AAR. That is to say, the anti-reflection member AR can overlap the sealing member SL.

According to an embodiment, the anti-reflection member AR is disposed on the lower surface of the second substrate 190 to reduce the amount of light reflected at the interface of the second substrate 190, and accordingly, an increased amount of light is transmitted by the second substrate 190. A detailed description thereon will be given below.

According to an embodiment, the sealing member SL is disposed between the first substrate 100 and the second substrate 190. For example, the sealing member SL is disposed in the non-active area NAR of the display device 1 and surrounds the active area AAR. The sealing member SL couples the first substrate 100 with the second substrate 190, and seals the active element layer ATL together with the first substrate 100 and the second substrate 190. According to an exemplary embodiment of the present disclosure, the sealing member SL includes, but is not limited to, frit.

According to an embodiment, the active element layer ATL and the anti-reflection member AR are disposed in an inner area of the display panel 10 that is defined by the first substrate 100, the second substrate 190 and the sealing member SL. In the inner area, an empty space EMT is located between the active element layer ATL and the anti-reflection member AR. The empty space EMT may be a vacuum or may be filled with a gas, etc. The gas may be, but is not limited to, an inert gas or a normal atmosphere. In other embodiments, the empty space EMT can be filled with a filler, etc., besides the gas. The empty space EMT overlaps a first through-hole HLE_TH1, shown in FIG. 4, which will be described below.

According to an embodiment, the touch member TSP is disposed on the display panel 10. The touch member TSP can sense a touch input. The touch member TSP is disposed on an upper or first surface of the second substrate 190. The touch member TSP may be integrally formed with the display panel 10 in the form of a touch layer, as illustrated in the following exemplary embodiments, but embodiments of the present disclosure are not limited thereto. The touch member TSP is formed on the display panel 10 in the form of a touch panel or a touch film. The touch member TSP includes a plurality of touch electrodes. However, in other embodiments, the touch member TSP is eliminated.

The cross-sectional structure of the touch member TSP will be described in more detail below.

According to an embodiment, the polarizer POL polarizes light passing therethrough. The polarizer POL reduces reflection of external light. The polarizer POL may be attached on the touch member TSP through a polarization coupling layer PLA, shown in FIGS. 6 and 7. When the touch member TSP is eliminated, the polarizer POL is attached on the second substrate 190.

According to an embodiment, the window member 20 is disposed on the polarizer POL. The window member 20 covers and protects the display panel 10. The window member 20 includes a window substrate 21 and a print layer 22 disposed on the window substrate 21. The window member 20 can be attached to one surface of the display panel 10 through a transparent coupling layer OCR that includes an optically clear adhesive (OCA) or an optically clear resin (OCR), etc. When the display device 1 includes a polarizer POL, the window member 20 is attached to the upper or first surface of the polarizer POL.

According to an embodiment, the window substrate 21 is made of a transparent material. The window substrate 21 may be made of, for example, glass or plastic According to an embodiment, the window substrate 21 conforms to the shape of the display device 1 when viewed from above, i.e., in a plan view. For example, when the display device 1 has a substantially rectangular shape in a plan view, the window substrate 21 also has a substantially rectangular shape. As another example, when the display device 1 is circular, the window substrate 21 also has a circular shape.

According to an embodiment, the print layer 22 is disposed on the window substrate 21. The print layer 22 is disposed on one or both of a first surface or a second surface of the window substrate 21. The print layer 22 is disposed on the edge of the window substrate 21 and is disposed in the non-active area NAR. In addition, the print layer 22 is also disposed in the hole area HLA. The print layer 22 is a light-blocking layer or a decorative layer that enhances an aesthetic appeal of the display device 1.

Hereinafter, the hole area of the display device will be described in detail.

Figure 3:
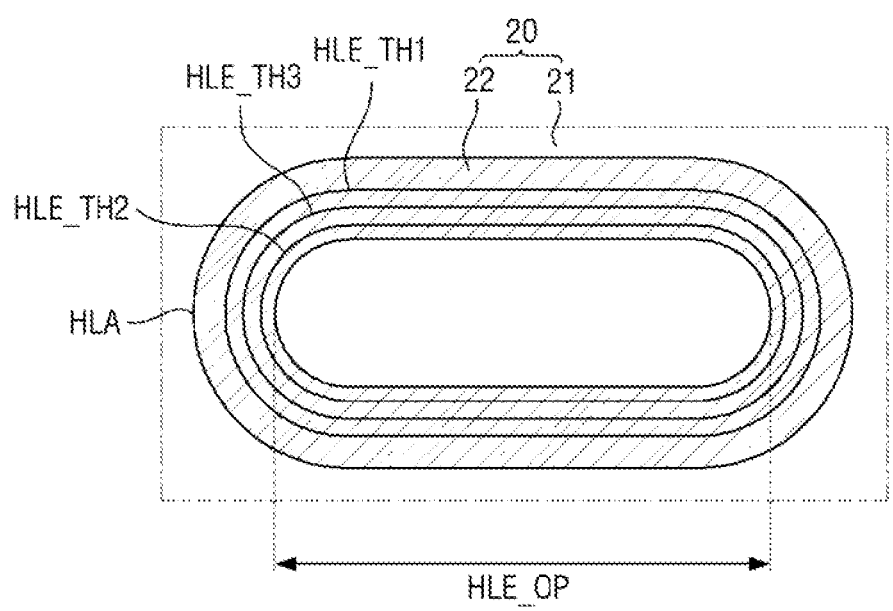
FIG. 3 illustrates the arrangement of elements around the hole area when viewed from above.
Figure 4:
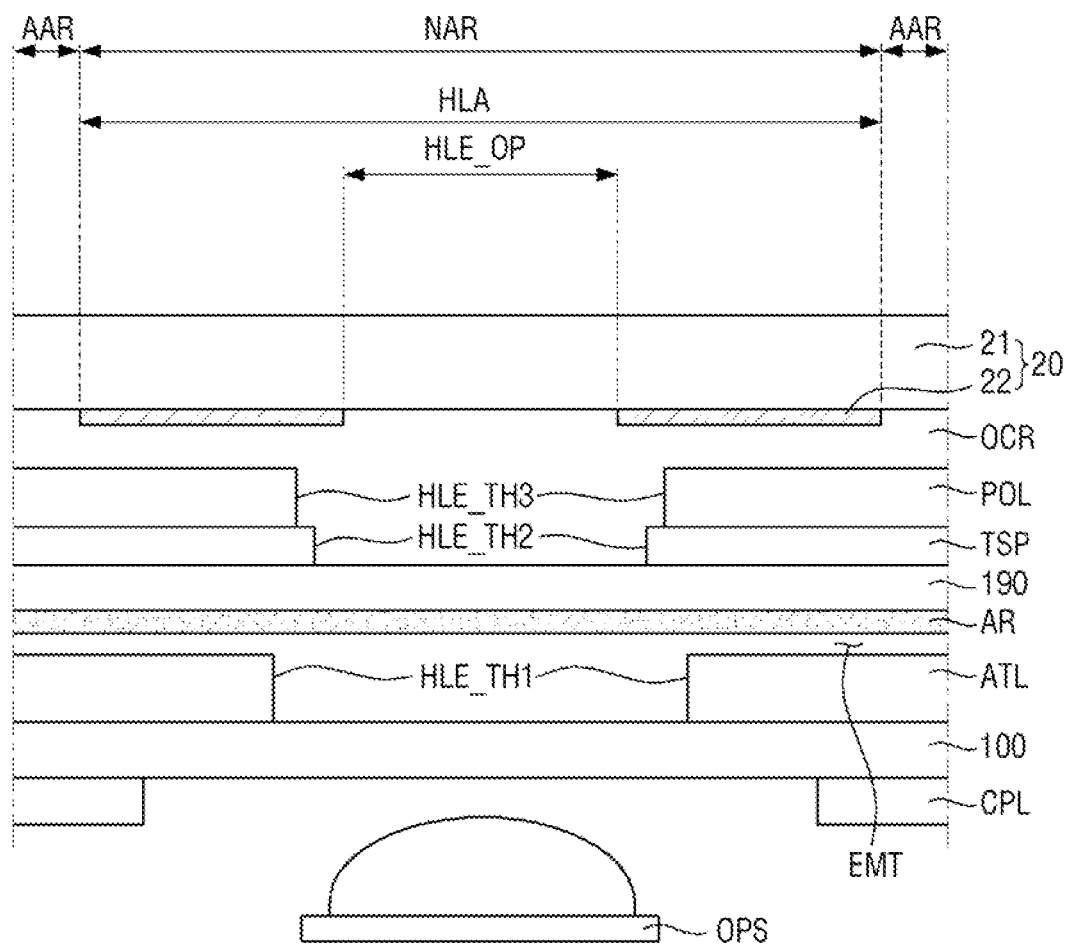
FIG. 4 is a cross-sectional view of the vicinity of a hole area of a display device according to an exemplary embodiment of the present disclosure.

FIG. 3 illustrates the arrangement of elements around the hole area when viewed from above. FIG. 4 is a cross-sectional view of the vicinity of a hole area of a display device according to an exemplary embodiment of the present disclosure.

Referring to FIGS. 1 to 4, according to an embodiment, the hole area HLA is located closer to one side of the display device 1 in the first direction DR1. The hole area HLA itself is the non-active area NAR in which no image is displayed or no touch is sensed. The hole area HLA is disposed inside the active area AAR. In other words, the hole area HLA is surrounded by the active area AAR as shown in FIG. 1. However, in another embodiments, the hole area HLA is surrounded by the non-active area NAR, or is disposed near the boundary between the active area AAR and the non-active area NAR such that a part of the hole area HLA is located in the active area AAR while the other part thereof is surrounded by the non-active area NAR.

The hole area HLA may have, but is not limited to, a circular shape, an oval shape, a dumbbell shape, a rectangular shape with rounded shorter sides, etc., when viewed from above. However, embodiments are not limited thereto, and in other embodiments, the hole area HLA has other shapes, such as a rectangle, a square, or other polygonal shapes.

According to an embodiment, the hole area HLA includes at least one hole HLE. The shape of the hole HLE conform to the shape of the hole area HLA, but embodiments of the present disclosure are not limited thereto. The hole HLE may have a circular shape, an elliptical shape, etc.

According to an embodiment, the hole HLE includes through-holes HLE_TH that physically penetrate the elements. The through-holes HLE_TH may have, but are not limited to, an elliptical shape when viewed from above. The through-holes HLE_TH include a first through-hole HLE_TH1 that physically penetrates the active element layer ATL of the display panel 10, a second through-hole HLE_TH2 that physically penetrates the touch member TSP, and a third through-hole HLE_TH3 that physically penetrates the polarizer POL. As elements are removed from the through-holes HLE_TH, light transmittance in the hole area HLA is improved.

According to an embodiment, the first through-hole HLE_TH1, the second through-hole HLE_TH2 and the third through-hole HLE_TH3 at least partially overlap each other. Accordingly, an optical path is provided through which outside light can be incident on an optical element OPS. The first through-hole HLE_TH1 overlaps the empty space EMT of the display panel 10. In addition, the second through-hole HLE_TH2 and the third through-hole HLE_TH3 also overlap the empty space EMT of the display panel 10.

According to an embodiment, an inner surface of the second through-hole HLE_TH2 and an inner surface of the third through-hole HLE_TH3 protrude inward from an inner surface of the first through-hole HLE_TH1, and the inner surface of the third through-hole HLE_TH3 2 is located inward from the inner surface of the through-hole HLE_TH2. It is, however, to be understood that embodiments of the present disclosure are not limited thereto. In other embodiments, the inner surfaces of the first through-hole HLE_TH1, the second through-hole HLE_TH2 and the third through-hole HLE_TH3 may have a variety of other locations.

According to an embodiment, the inside of the first through-hole HLE_TH1 in the active element layer ATL may be in a vacuum state or filled with a gas, like in the empty space EMT. The second through-hole HLE_TH2 in the touch member TSP and the third through-hole HLE_TH3 in the polarizer POL are filled with the optically clear resin OCR.

According to an embodiment, the first substrate 100 and the second substrate 190 of the display panel 10, and the window member 20 are physically penetrated and thus through-holes HLE_TH are not formed therethrough. As described above, since the first substrate 100 and the second substrate 190 of the display panel 10 have high light transmittance, high light transmittance can be maintained without forming holes therethrough. Since the window substrate 21 of the window member 20 itself has a high light transmittance, a high light transmittance can be maintained without forming a hole. In addition, as the window member 20 is not penetrated above the through-holes HLE_TH, it can physically cover and protect the elements therebelow.

According to an embodiment, the hole area HLA further includes an optical hole HLE_OP, which is an optical transmissive window, in addition to the through-holes HLE_TH. The optical hole HLE_OP overlaps the through-hole HLE_TH, and is formed by a pattern of the print layer 22 of the window member 20. The print layer 22 is disposed in a part of the hole area HLA and blocks light of the pixel PX through the through-holes HLE_TH, thus preventing light leakage. The print layer 22 extends to the outer periphery of the hole area HLA, but embodiments of the present disclosure are not limited thereto.

According to an embodiment, the print layer 22 is disposed around the through-hole HLE_TH, and exposes at least a part of the through-hole HLE_TH. The area of the through-holes HLE_TH exposed by the print layer 22 become the optical hole HLE_OP through which light passes. According to an exemplary embodiment of the present disclosure, the print layer 22 of the hole area HLA partially overlaps the through-holes HLE_TH. That is to say, the inner surface of the print layer 22 protrudes further inward from the inner wall of the through-holes HLE_TH. The inner surface of the print layer 22 may be aligned with the inner wall of those through-holes HLE_TH that have a minimum radius, or may protrude further inward from the minimum radius inner wall. Accordingly, the inner walls of the first through-hole HLE_TH1, the second through-hole HLE_TH2 and the third through-hole HLE_TH3 under the printed layer 22 are hidden by the print layer 22 so that they cannot be seen from the outside.

According to an embodiment, the display device 1 further includes the optical element OPS that includes a light-receiving unit. Examples of the optical element OPS that include a light-receiving unit include a camera, a lens, such as a condensing lens, a light path guide lens, etc., an optical sensor such as an infrared sensor, an iris recognition sensor, or an luminance sensor, etc. The optical element OPS is disposed on the other side of the display panel 10 from the window member 20 and overlaps the hole area HLA. At least a part of the light-receiving unit of the optical element OPS is located in the optical hole HLE_OP. Light outside the display device 1 can pass through the window substrate 21 surrounded by the printed layer 22, through the through-holes HLE_TH, the first substrate 100 and the second substrate 190 of the display panel 10 thereunder to be incident on the light-receiving unit. As described above, when the window substrate 21, and the first substrate 100 and the second substrate 190 of the display panel 10 have a high transmittance, outside light can reach the light-receiving unit of the optical element OPS through the above-described optical path, without any significant loss.

According to an embodiment, the display device 1 further includes the cover panel CPL. The cover panel CPL is disposed on the second surface of the first substrate 100. The cover panel CPL may include a heat dissipation layer, a cushion layer, etc. The cover panel CPL does not overlap or cover any of the optical hole HLE_OP and the through-holes HLE_TH.

The circuit and the cross-sectional structure of the pixel PX of the display device 1 will now be described.

Figure 5:
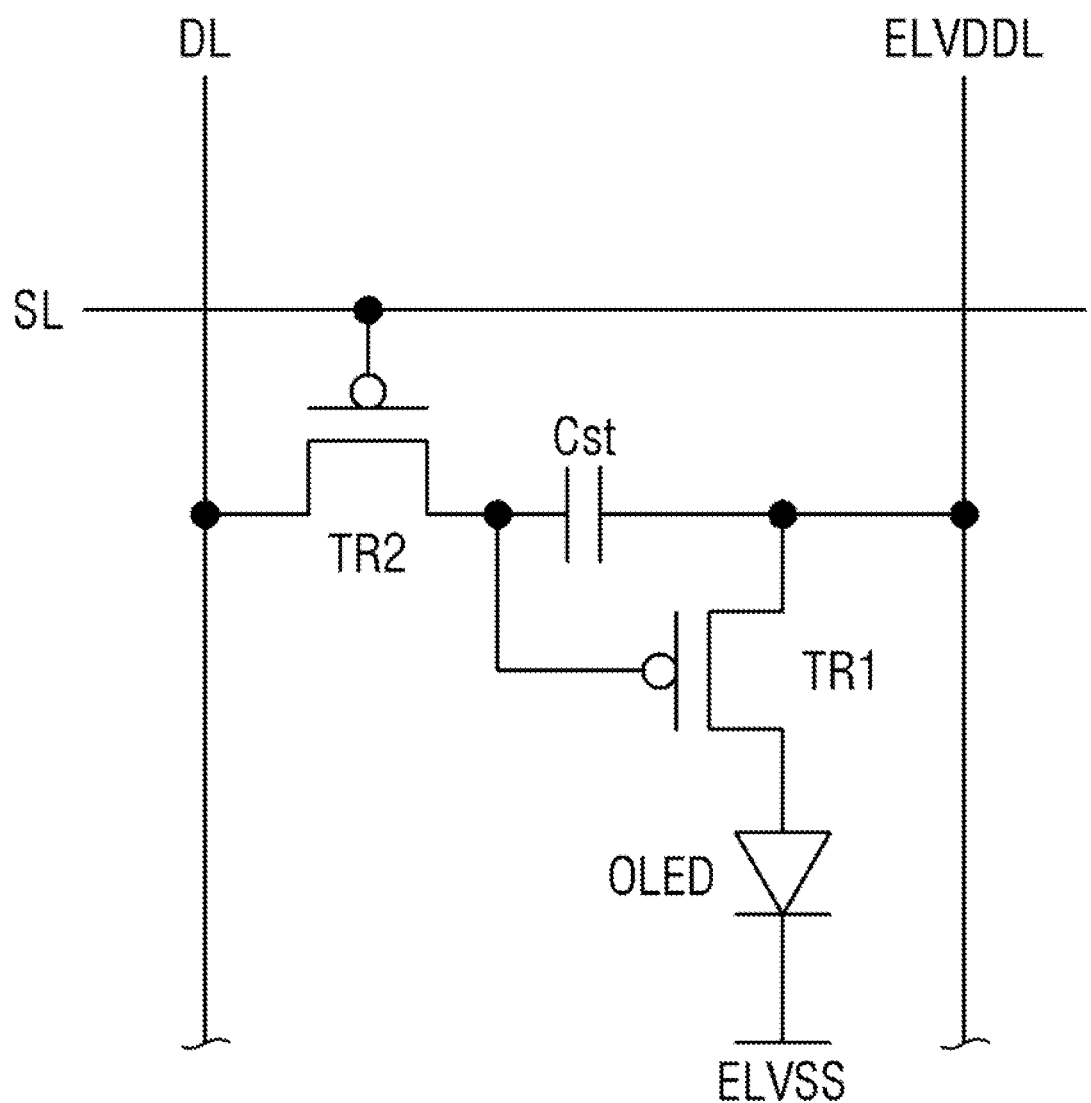
FIG. 5 is a circuit diagram of one pixel of a display device according to an exemplary embodiment of the present disclosure.

FIG. 5 is a circuit diagram of one pixel of a display device according to an exemplary embodiment of the present disclosure.

Referring to FIG. 5, according to an embodiment, the pixel circuit may include a first transistor TR1, a second transistor TR2, a capacitor Cst, and an organic light-emitting diode OLED. A scan line SL, a data line DL, and a first supply voltage line ELVDDL are connected to each pixel circuit.

According to an embodiment, the first transistor TR1 is a driving transistor, and the second transistor TR2 is a switching transistor. Although both the first transistor TR1 and the second transistor TR2 are PMOS transistors in the drawings, one or both of the first transistor TR1 or the second transistor TR2 may be NMOS transistors.

According to an embodiment, the first or source electrode of the first transistor TR1 is connected to the first supply voltage line ELVDDL, and the second or drain electrode is connected to the anode electrode of the organic light-emitting diode OLED. The first or source electrode of the second transistor TR2 is connected to the data line DL, and the second or drain electrode thereof is connected to the gate electrode of the first transistor TR1. The capacitor Cst is connected between the gate electrode and the first electrode of the first transistor TR1. The cathode electrode of the organic light-emitting diode OLED receives a second supply voltage ELVSS. The second supply voltage ELVSS has a voltage level that is lower than that of the first supply voltage ELVDD received from the first supply voltage line ELVDDL.

According to an embodiment, the second transistor TR2 outputs a data signal received from the data line DL in response to a scan signal received from the scan line GL. The capacitor Cst is charged with a voltage that corresponds to the data signal received from the second transistor TR2. The first transistor TR1 controls the driving current flowing to the organic light-emitting diode OLED in response to the amount of charge stored in the capacitor Cst.

According to an embodiment, the equivalent circuit of FIG. 5 is merely a non-limiting example, and in other embodiments, the pixel circuit can include more transistors, e.g., seven transistors and capacitors.

Figure 7:
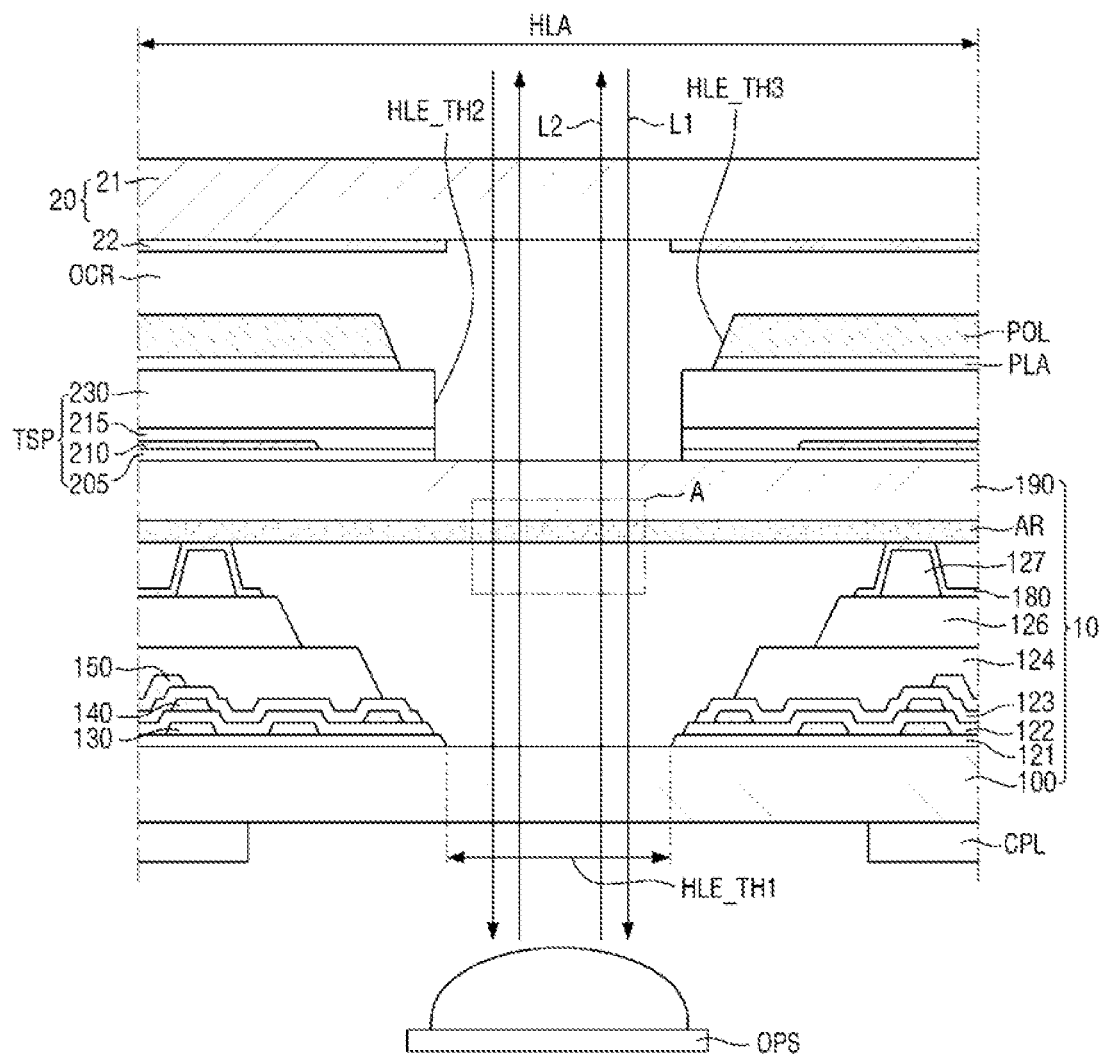
FIG. 7 is a cross-sectional view of the vicinity of the hole area of a display device of FIG. 6.

FIG. 6 is a cross-sectional view of a pixel of a display device according to an exemplary embodiment of the present disclosure. FIG. 7 is a cross-sectional view of the vicinity of the hole area of the display device of FIG. 6. Each of the elements of the display device 1 will be described in detail with reference to FIGS. 6 and 7.

Referring to FIGS. 6 and 7, according to an embodiment, the active element layer ATL covers most of the first substrate 100 except for the portion of the first through-hole HLE_TH1. The active element layer ATL includes a semiconductor layer 110, a first insulating layer 121, a first gate conductive layer 130, a second insulating layer 122, a second gate conductive layer 140, a third insulating layer 123, a data conductive layer 150, a fourth insulating layer 124, an anode electrode 160, a bank layer 126 that includes an opening that exposes the anode electrode 160, an emission layer 170 disposed in the opening of the bank 126, and a cathode electrode 180 disposed on the emission layer 170 and the bank layer 126. The layers are sequentially stacked in the above described order. Each of the layers may be a single layer or include a plurality of layers. Other layers may be further disposed between the disclosed layers.

According to an embodiment, the semiconductor layer 110 is disposed on the first substrate 100. The semiconductor layer 110 forms a channel of a thin-film transistor of the pixel PX. The semiconductor layer 110 includes polycrystalline silicon. However, embodiments of the present disclosure are not limited thereto. In other embodiments, the semiconductor layer 110 may include monocrystalline silicon, low-temperature polycrystalline silicon, amorphous silicon, or an oxide semiconductor. The oxide semiconductor may include, for example, a binary compound (ABx), a ternary compound (ABxCy), or a quaternary compound (ABxCyDz) that contains some of indium, zinc, gallium, tin, titanium, aluminum, hafnium (Hf), zirconium (Zr), magnesium (Mg), etc.

According to an embodiment, the first insulating layer 121 is disposed on the semiconductor layer 110 and the substrate 100. The first insulating layer 121 is a first gate insulating film. The first insulating layer 121 may include a silicon compound or a metal oxide, etc. For example, the first insulating layer 121 may include one or more of silicon oxide, silicon nitride, silicon oxynitride, aluminum oxide, tantalum oxide, hafnium oxide, zirconium oxide, or titanium oxide, etc.

According to an embodiment, the first gate conductive layer 130 is disposed on the first insulating layer 121. The first gate conductive layer 130 includes a gate electrode GAT of the thin-film transistor of the pixel PX and a scan line connected thereto, and a first electrode CE1 of a storage capacitor.

According to an embodiment, the first gate conductive layer 130 includes at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) or copper (Cu).

According to an embodiment, a second insulating layer 122 is disposed on the first gate conductive layer 130 and the first insulating layer 121. The second insulating layer 122 may be an interlayer dielectric layer or a second gate insulating layer. The second insulating layer 122 includes an inorganic insulating material such as silicon oxide, silicon nitride, silicon oxynitride, hafnium oxide, aluminum oxide, titanium oxide, tantalum oxide or zinc oxide.

According to an embodiment, the second gate conductive layer 140 is disposed on the second insulating layer 122. The second gate conductive layer 140 includes a second electrode CE2 of the storage capacitor. The second gate conductive layer 140 includes at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) or copper (Cu). The second gate conductive layer 140 is made of, but is not limited to, the same material as the first gate conductive layer 130.

According to an embodiment, the third insulating layer 123 is disposed on the second gate conductive layer 140 and the second insulating layer 122. The third insulating layer 123 is an interlayer dielectric layer. The third insulating layer 123 includes an inorganic insulating material such as silicon oxide, silicon nitride, silicon oxynitride, hafnium oxide, aluminum oxide, titanium oxide, tantalum oxide or zinc oxide.

According to an embodiment, the data conductive layer 150 is disposed on the third insulating layer 123. The data conductive layer 150 includes a first electrode SD1 and a second electrode SD2 of the thin-film transistor of the pixel PX. The first electrode SD1 and the second electrode SD2 of the thin-film transistor are electrically connected to the source region and the drain region of the semiconductor layer 110, respectively, through contact holes that penetrate the third insulating layer 123, the second insulating layer 122 and the first insulating layer 121. A first supply voltage electrode ELVDDE of the pixel PX is also formed from the data conductive layer 150. The first supply voltage line ELVDDE is electrically connected to the second electrode CE2 of the storage capacitor through a contact hole that penetrates the third insulating layer 123.

According to an embodiment, the data conductive layer 150 includes at least one metal selected from aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) or copper (Cu). The data conductive layer 150 may have a single layer or multiple layers. For example, the data conductive layer 150 may have a stack structure of Ti/Al/Ti, Mo/Al/Mo, Mo/AlGe/Mo, or Ti/Cu.

According to an embodiment, the fourth insulating layer 124 is disposed on the data conductive layer 150 and the third insulating layer. The fourth insulating layer 124 covers the data conductive layer 150. The fourth insulation layer 124 is a via layer. The fourth insulating layer 124 includes an organic insulating material such as polyacrylate resin, epoxy resin, phenolic resin, polyamide resin, polyimide resin, unsaturated polyesters resin, poly phenylene ether resin, poly phenylene sulfide resin, or benzocyclobutene (BCB).

According to an embodiment, the anode electrode 160 is disposed on the fourth insulating layer 124. The anode electrode 160 is a pixel electrode for each pixel PX. The anode electrode 160 is electrically connected to the second electrode SD2 of the thin-film transistor through a contact hole that penetrates the fourth insulating layer 124. The anode electrode 160 at least partially overlaps the emission area EMA of the pixel PX.

According to an embodiment, the anode electrode 160 may have, but is not limited to, a stack structure of materials that have a high work function, such as indium-tin-oxide (ITO), indium-zinc-oxide (IZO), zinc oxide (ZnO) or indium oxide (In$_2$O$_3$), and a reflective material layer, such as silver (Ag), magnesium (Mg), aluminum (Al), platinum (Pt), lead (Pd), gold (Au), nickel (Ni), neodymium (Nd), iridium (Ir), chromium (Cr), lithium (Li), or calcium (Ca), or a mixture thereof. A layer that has a higher work function is disposed on a reflective material layer to be disposed closer to the emission layer 170. For example, the anode electrode 160 may have, but is not limited to, a multilayer structure of ITO/Mg, ITO/MgF, ITO/Ag, or ITO/Ag/ITO.

According to an embodiment, a bank layer 126 is disposed on the anode electrode 160 and the fourth insulating later 124. The bank layer 126 is disposed over the edges of the anode electrode 160 and includes an opening that exposes the anode electrode 160. The bank layer 126 serves as a pixel definition later. The emission area EMA and the non-emission area NEM respectively correspond to the opening and the bank layer 126. The bank layer 126 includes an organic insulating material such as polyacrylate resin, epoxy resin, phenolic resin, polyamide resin, polyimide resin, unsaturated polyesters resin, poly phenylen ether resin, poly phenylene sulfide resin, or benzocyclobutene (BCB). The bank layer 126 may include an inorganic material.

According to an embodiment, the display device 1 further includes a spacer 127. The spacer 127 is disposed on the bank layer 126. The spacer 127 may be disposed directly on the bank layer 126. The spacer 127 overlaps the bank layer 126. The spacer 127 maintains a gap with elements disposed thereabove. For example, during a process of depositing an organic material of the emission layer by using a fine metal mask (FMM), the spacer 127 can prevent sagging of the fine metal mask. In some embodiments, the spacer 127 supports the elements stacked thereon and reduces deformations due to stress applied when the display panel 10 is pressed. The spacer 127 has a width that is less than that of the bank layer 126. The spacer 127 is disposed on a part of the bank layer 126 and provides a step difference from the other part.

According to an embodiment, the spacer 127 includes an organic insulating material, like the bank layer 126. The spacer 127 may be formed as a separate layer from the bank layer 126, or may be formed via the same process as the bank layer 126 and with the same material. For example, the bank layer 126 and the spacer 127 can be formed by a single process by applying a photosensitive organic material and then exposing and developing the material with a slit mask or a halftone mask.

According to an embodiment, the emission layer 170 is disposed on the portion of the anode electrode 160 exposed by the bank layer 126. The emission layer 170 includes an organic material layer. The organic material layer of the emission layer includes an organic emission layer and may further include one or more of a hole injecting/transporting layer or an electron injecting/transporting layer.

According to an embodiment, the cathode electrode 180 is disposed on the emission layer 170 and the bank 126. The cathode electrode 180 is a common electrode disposed across the pixels. The anode electrode 160, the emission layer 170 and the cathode electrode 180 form an organic light-emitting element.

According to an embodiment, the cathode electrode 180 is in contact with the emission layer 170 as well as the upper surface of the bank layer 126. In addition, in the region where the spacer 127 is formed, the cathode electrode 180 is in contact with the side and upper surfaces of the spacer 127 and covers the surfaces of the spacer 127. The cathode electrode 180 is formed conformally to the underlying elements to reflect the step differences of the underlying elements.

According to an embodiment, the cathode electrode 180 include a material layer that has a small work function, such as Li, Ca, LiF/Ca, LiF/Al, Al, Mg, Ag, Pt, Pd, Ni, Au, Nd, Ir, Cr, BaF or Ba, or a compound or mixture thereof, such as a mixture of Ag and Mg. The cathode electrode 180 further includes a transparent metal oxide layer disposed on the material layer that has a small work function.

According to an embodiment, the anti-reflection member AR and the second substrate 190 are disposed above the cathode electrode 180. The anti-reflection member AR is disposed on the cathode electrode 180, and the second substrate 190 is disposed on the anti-reflection member AR. The second substrate 190 has been described above, and thus redundant description will be omitted.

According to an embodiment, the anti-reflection member AR is disposed on the lower surface of the second substrate 190. The thickness of the anti-reflection member AR ranges from 200 nm to 300 nm or from 100 nm to 500 nm. The anti-reflection member AR may be formed on the lower surface of the second substrate 190 by sputter, for example.

According to an embodiment, the anti-reflection member AR improves the transmittance of external light L1 that passes through the second substrate 190, and prevents or suppresses the light L2 reflected by the optical element OPS from being reflected again at the second substrate 190. The anti-reflection member AR is disposed to overlap at least one of the optical hole HLE_OP, the first through-hole HLE_TH1, the second through-hole HLE_TH2, or the third through-hole HLE_TH3.

Figure 8:
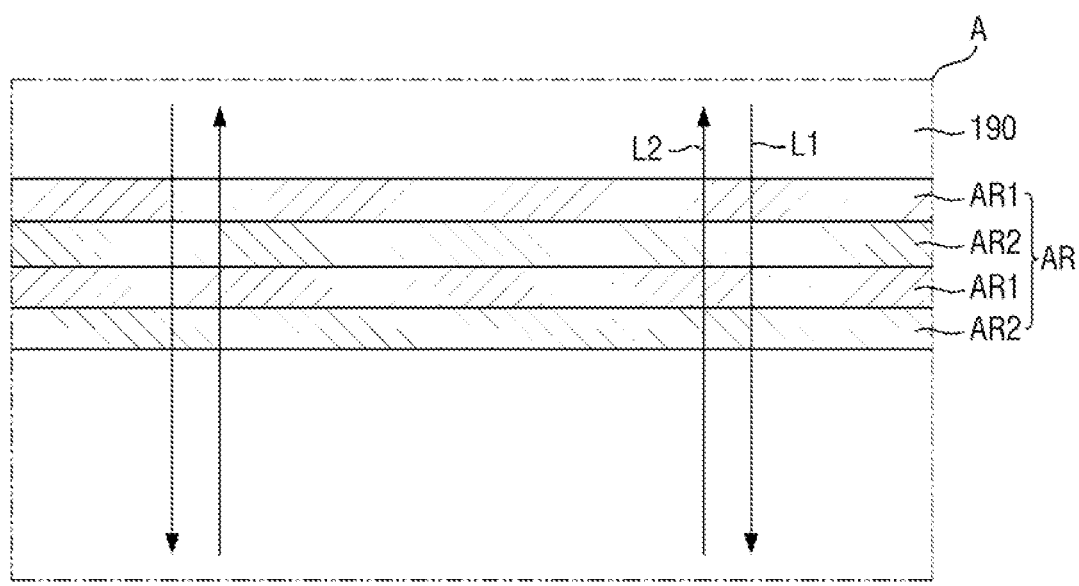
FIG. 8 is an enlarged view of area A of FIG. 7.

FIG. 8 is an enlarged view of area A of FIG. 7.

Referring to FIG. 8, according to an embodiment, the anti-reflection member AR includes first refractive layers AR1 and second refractive layers AR2. The refractive index of the first refractive layers AR1 is greater than that of the second refractive layers AR2. In other words, the first refractive layers AR1 are high refractive index layers, while the second refractive layers AR2 are low refractive index layers. The refractive index of the first refractive layers AR1 is greater than that of the second substrate 190, and the refractive index of the second refractive layers AR2 is less than or equal to that of the second substrate 190. The refractive index of the first refractive layers AR1 may be, but is not limited to, 2.3 or may range from 2.0 to 2.6. The refractive index of the second refractive layers AR2 may be 1.5 or may range from 1.2 to 1.8.

According to an embodiment, the first refractive layers AR1 include a first inorganic material. The first inorganic material includes, for example, at least one of silicon nitride ($SiN_x$), aluminum oxide ($AlO_x$), titanium oxide ($TiO_x$), or niobium oxide ($Nb_2O_5$). The second refractive layers AR2 include a second inorganic material. The second inorganic material may include, but is not limited to, silicon oxide ($SiO_2$).

According to an embodiment, the first refractive layers AR1 and the second refractive layers AR2 are alternately disposed on the lower surface of the second substrate 190. In other words, the first refractive layer AR1 is disposed on the lower surface of the second substrate 190 in direct contact with the second substrate 190, and the second refractive layer AR2 is disposed on the lower surface of the first refractive layer AR1. Another first refractive layer AR1 is disposed on the lower surface of the second refractive layer AR2, and another second refractive layer AR2 is disposed on the lower surface of the first refractive layer AR1.

According to an embodiment, although the two first refractive layers AR1 and the two second refractive layers AR2 are alternately arranged in FIG. 8, embodiments of the present disclosure are not limited thereto. In other embodiments, the anti-reflection member AR may include one first refractive layer AR1 and one second refractive layer AR2, or may include three or more first refractive layers AR1 and three or more second refractive layers AR2.

According to an embodiment, since the anti-reflection member AR is disposed on the second substrate 190, the transmittance of external light L1 through one or more of the first through-hole HLE_TH1 or the optical hole HLE_OP can be increased, and deviations of the light transmittance of the light L1 can be reduced. In addition, in one or more of the first through-hole HLE_TH1 or the optical hole HLE_OP, light L2 reflected by the optical element OPS can be at least partially prevented from being reflected by the lower surface of the second substrate 190. In addition, deterioration of image quality of the optical element OPS and the flare phenomenon due to the light L2 reflected by the optical element OPS can be suppressed or prevented. A detailed description thereon will be given below.

Referring back to FIGS. 6 and 7, the touch member TSP is disposed on the display panel 10. In a cross-sectional structure, the touch member TSP includes a touch base layer 205 disposed on the second substrate 190, a first touch conductive layer 210 disposed on the touch base layer 205, a first touch insulating layer 215 disposed on the first touch conductive layer 210, and a second touch insulating or capping layer 230 disposed on the first touch insulating layer 215. In some embodiments, the touch base layer 205 can be eliminated. Although not shown in the drawings, the touch member TSP further includes a second touch conductive layer disposed between the first touch insulating layer 215 and the second touch insulating layer 230.

According to an embodiment, the touch member TSP includes a plurality of sensing electrodes SP1 and SP2. The plurality of sensing electrodes are arranged in a matrix in the active area AAR. The sensing electrodes are not disposed around the hole area HLA. An exemplary layout of sensing electrodes of the touch member TSP is shown in FIGS. 9 and 10.

Figure 9:
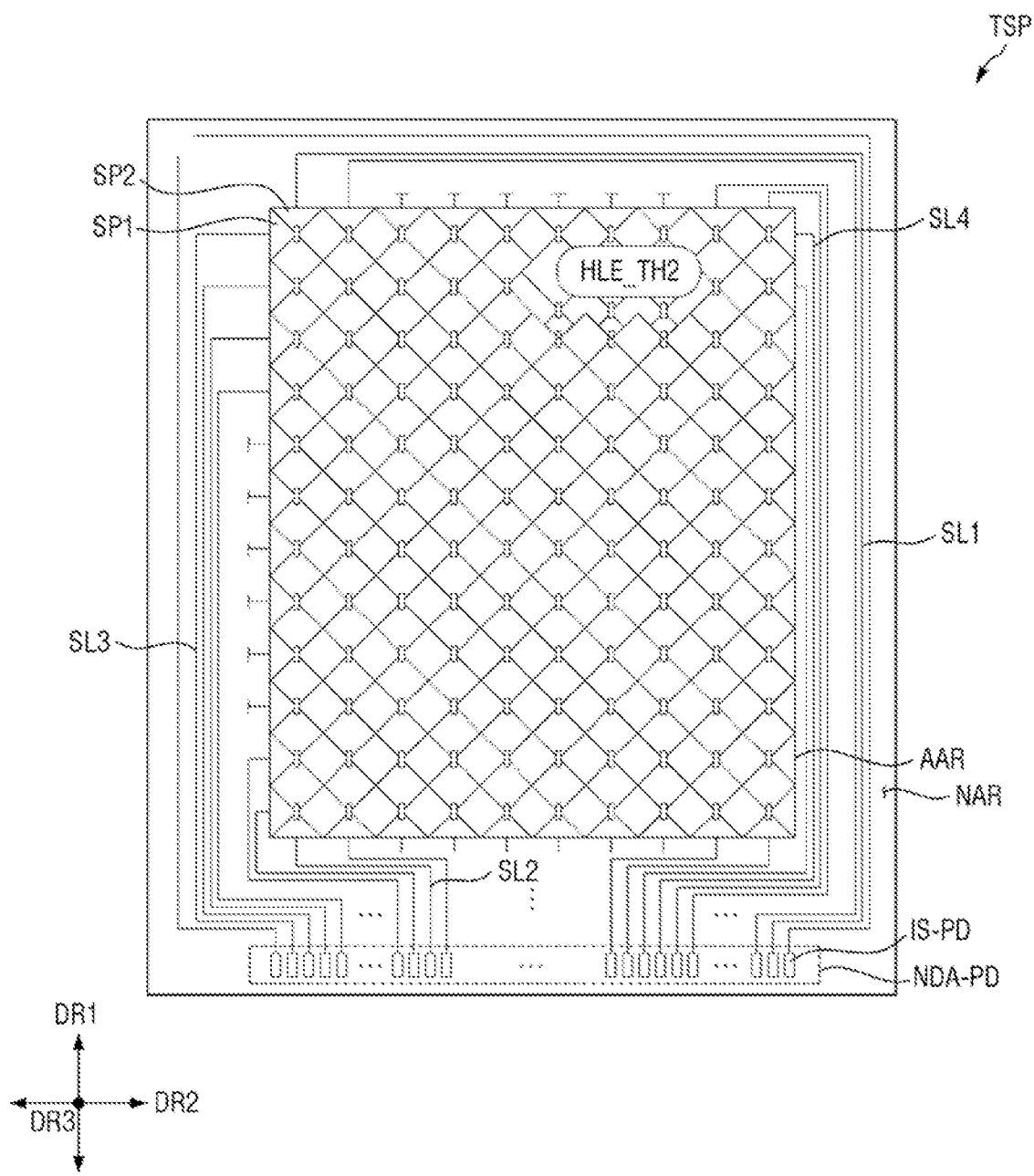
FIG. 9 illustrates a layout of a touch member according to an exemplary embodiment of the present disclosure.

FIG. 9 illustrates a layout of a touch member according to an exemplary embodiment of the present disclosure. FIG. 10 illustrates a layout of a touch member in the vicinity of a hole area.

Figure 10:
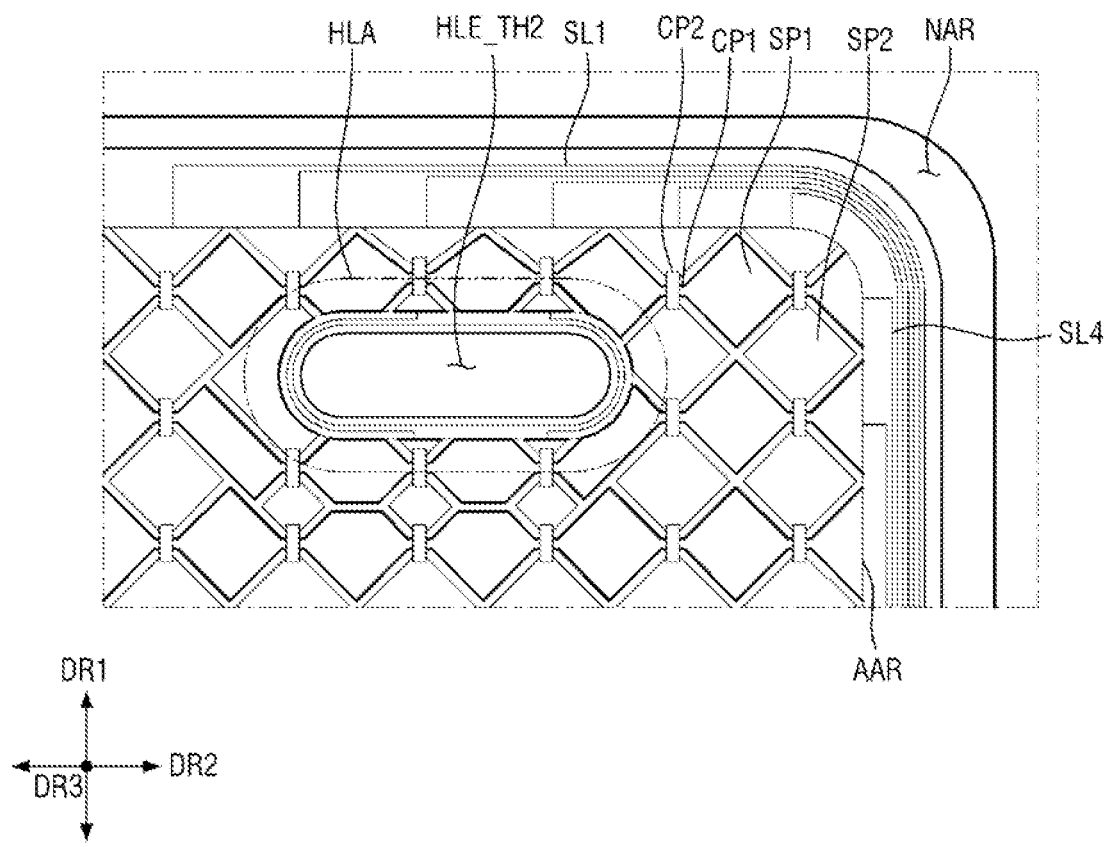
FIG. 10 illustrates a layout of a touch member in the vicinity of a hole area.

Referring to FIGS. 9 and 10, according to an embodiment, the touch member TSP includes first sensing electrodes SP1 and second sensing electrodes SP2 or driving electrodes disposed in the active area AAR, and first signal lines SL1, second signal lines SL2, third signal lines SL3 and fourth signal lines SL4 disposed in the non-active area. The touch member TSP further includes touch or sensing pads IS-PD disposed in the non-active area NAR.

According to an embodiment, the first sensing electrodes SP1 extend in the second direction DR2 and are spaced apart in the first direction DR1. The first sensing electrodes SP1 are directly connected with each other by first connectors CP1. That is to say, the first sensing electrodes SP1 and first connectors CP1 are integrally formed. The first sensing electrodes SP1 transmit sensing signals.

According to an embodiment, the second sensing electrodes SP2 extend in the first direction DR1 and spaced apart in the second direction DR2. The second sensing electrodes SP2 are electrically connected with each other by second connectors CP2 spaced apart from the first sensing electrodes SP1 and the first connectors CP1. The second connectors CP2 are separate elements from the second sensing electrodes SP2. The second sensing electrodes SP2 transmit detection signals.

According to an embodiment, the second sensing electrodes SP2 are spaced apart from the first sensing electrodes SP1 and the first connectors CP1. The second touch conductive layer includes the second connectors CP2. The second connectors CP2 are electrically connected to the second sensing electrodes SP2 through contact holes.

According to an embodiment, the first sensing electrodes SP1, the second sensing electrodes SP2 and the first connectors CP1 are formed as one of the first touch conductive layer 210 or the second touch conductive layer, and the second connectors are formed as the other of the first touch conductive layer 210 or the second touch conductive layer. For example, the first sensing electrodes SP1, the second sensing electrodes SP2 and the first connectors CP1 are formed as the first touch conductive layer 210, and the second connectors CP2 are formed as the second touch conductive layer.

In this example, according to an embodiment, the first touch conductive layer 210 includes a transparent conductive layer. The transparent conductive layer includes a transparent conductive oxide such as indium tin oxide (ITO), indium zinc oxide (IZO), zinc oxide (ZnO) or indium tin zinc oxide (ITZO). The second touch conductive layer includes a material having a lower resistance than the transparent conductive layer.

According to an embodiment, each of the touch base layer 205, the first touch insulating layer 215 and the second touch insulating layer 230 may include inorganic material, organic materials, or composite materials. The inorganic layer includes at least one of aluminum oxide, titanium oxide, silicon oxide, silicon oxynitride, zirconium oxide, or hafnium oxide. The organic layer includes at least one of an acrylic resin, a methacrylic resin, a polyisoprene, a vinyl resin, an epoxy resin, a urethane resin, a cellulose resin, a siloxane resin, a polyimide resin, a polyamide resin, or a perylene resin.

According to an embodiment, the signal lines include the second touch conductive layer, and in some embodiments, have a stack structure of the first touch conductive layer 210 and the second touch conductive layer.

According to an embodiment, the first sensing electrodes SP1, the second sensing electrodes SP2, the first connectors CP1 and the second connectors CP2 are not disposed in at least a part of the hole area HLA. In other words, the touch member TSP includes a second through-hole HLE_TH2 in the hole area HLA, and the first sensing electrodes SP1, the second sensing electrode SP2, the first connectors CP1 and the second connectors CP2 are not disposed in the second through-hole HLE_TH2.

According to an embodiment, the shapes and sizes of the first sensing electrodes SP1 and the second sensing electrodes SP2 that are disposed around the second through-hole HLE_TH2 differ from the shapes and sizes of the other first sensing electrode SP1 and second sensing electrode SP2. Although embodiments are not limited thereto, for example, the first sensing electrodes SP1 and the second sensing electrodes SP2 disposed around the second through-hole HLE_TH2 are smaller in size or partially removed.

In the vicinity of the second through-hole HLE_TH2, according to an embodiment, the first sensing electrodes SP1 and the first connectors CP1 extend around the second through-hole HLE_TH2. In addition, the second connectors CP2 extend around the second through-hole HLE_TH2.

According to an embodiment, the first signal lines SL1, the second signal lines SL2, the third signal lines SL3 and the fourth signal lines SL4-1 and SL4-2 are disposed in the non-active area NAR.

According to an embodiment, the first signal lines SL1 extends from the touch pads IS-PD in the non-active area NAR along one side, such as the right side, of the touch member TSP, and are connected to first ends of the second sensing electrodes SP2.

According to an embodiment, the second signal lines SL2 extend from the touch pads IS-PD to one side, such as a lower side, of the active area AAR, and are electrically connected to the other ends of the second sensing electrodes SP2.

According to an embodiment, the third signal lines SL3 extend from the touch pads IS-PD in the non-active area NAR along one side, such as the left side, of the touch member TSP, and are electrically connected to first ends of the first sensing electrodes SP1.

According to an embodiment, the fourth signal lines SL4 extend from the touch pads along the non-active area NAR along one side, such as the left side, of the touch member TSP, and are connected to some of the first sensing electrodes SP1.

Hereinafter, the optical role of the anti-reflection member AR will be described in more detail.

Figure 11:
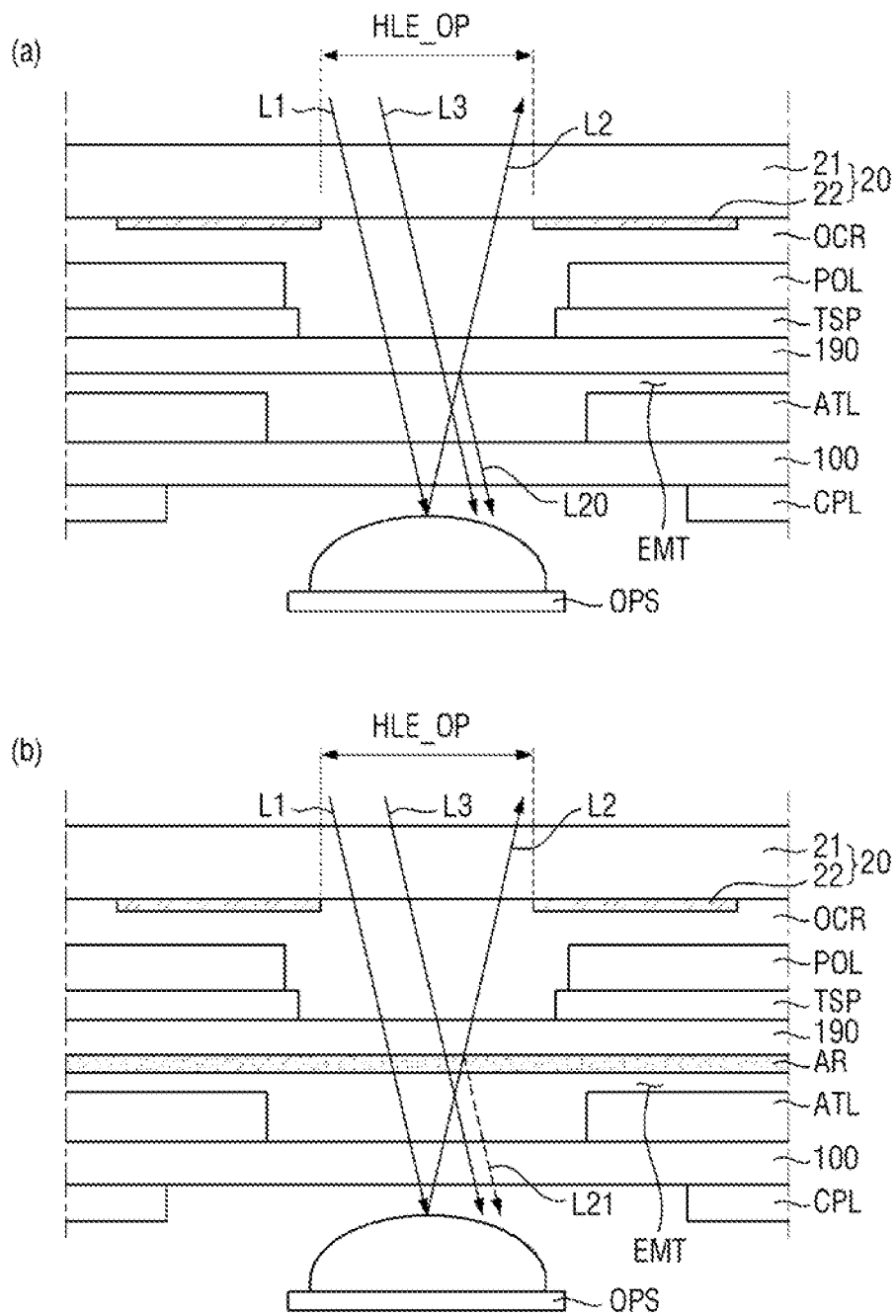
FIG. 11 are cross-sectional views that compare the direction in which light propagates around the second substrate depending on whether the anti-reflection member is disposed.

FIG. 11 are cross sectional views that compare the direction in which light propagates around the second substrate, depending on whether or not the anti-reflection member is disposed. FIG. 11 shows cross-sectional views around the hole in a display device. The cross-sectional view (a) shown on the upper part of FIG. 11 is an example where the display device does not include the anti-reflection member AR, while the cross-sectional view (b) shown on the lower part of FIG. 11 is an example where the display device 1 includes the anti-reflection member AR as in the above-described exemplary embodiments.

Referring to FIG. 11, according to an embodiment, lights L1 and L3 that are externally incident pass through the optical hole HLE_OP to reach the optical element OPS. Some of the lights L1 and L3 reach the optical element OPS and are then reflected by the optical element OPS. Some of the light L2 reflected by the optical element OPS is reflected again from the lower surface of the second substrate 190 while propagating upward. Lights L20 and L21 reflected again from the lower surface of the second substrate 190 reinforce or interfere with some of the lights L1 and L3 that are propagating downward. In addition, the lights L20 and L21 reflected again off the lower surface of the second substrate 190 may be incident on the optical element OPS again.

In this manner, according to an embodiment, by disposing the anti-reflection member AR on the lower surface of the second substrate 190, it is possible to prevent or suppress the light L2 reflected by the optical element OPS from being reflected again at the lower surface of the second substrate 190. In this case, by suppressing or preventing the light L21 from being reflected again at the lower surface of the second substrate 190, it is possible to suppress or prevent the light L21 from reinforcing or interfering with the external lights L1 and L3. In this manner, deviations of light transmittance of external light incident can be reduced, and the optical element OPS and the display device 1 including the same can be operated more efficiently. In addition, by suppressing or preventing the light L21 from being reflected again at the lower surface of the second substrate 190, it is possible to suppress or prevent the light 121 from being incident on the optical element OPS again. In this manner, it is possible to suppress or prevent a flare phenomenon in the optical element OPS, and the optical element OPS and the display device 1 including the same can be operated more efficiently.

In the foregoing description, the external light i is reflected at the lower surface of the optical element OPS and the second substrate 190, but embodiments of the present disclosure are not limited thereto. In other embodiments, external light is reflected at the interface of the active element layer ATL, the touch member TSP, and the first substrate 100, etc., inside the display device 1. As a result, the light reflected at the elements can reinforce or interfere with the external light, or may be incident on the optical element OPS again.

Figure 12:
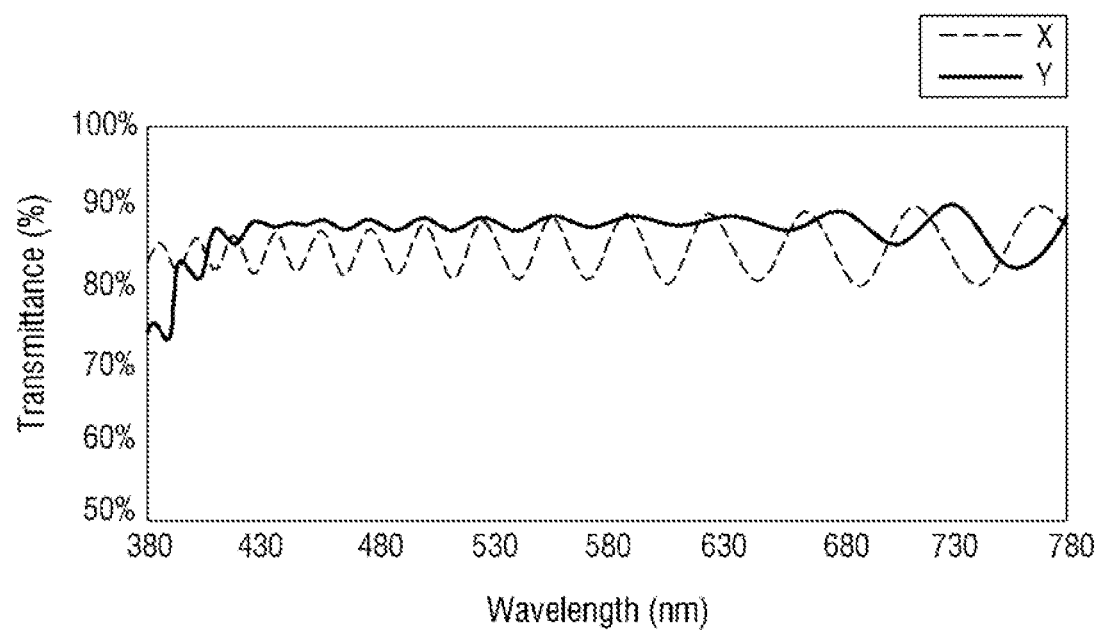
FIG. 12 is a graph of the deviations of light transmittance versus wavelength.
Figure 13:
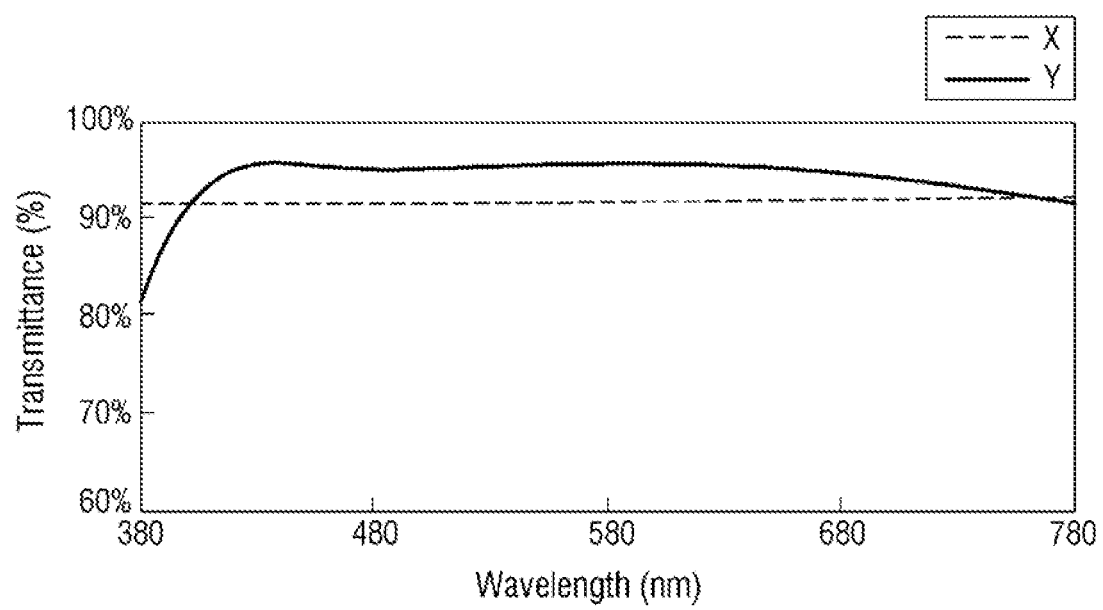
FIG. 13 is a graph of the light transmittance versus wavelength.
Figure 14:
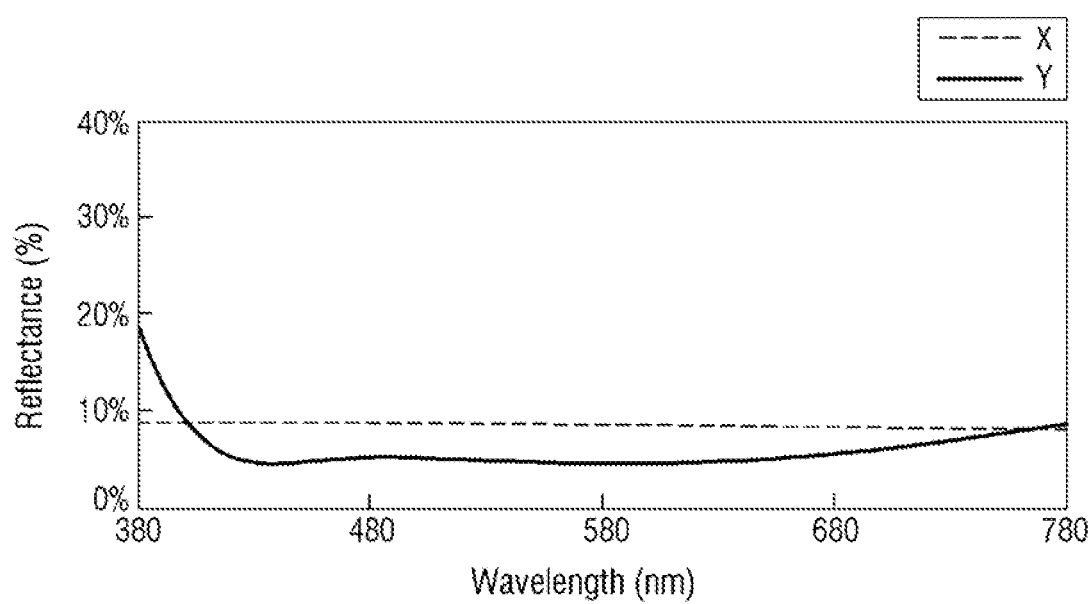
FIG. 14 is a graph of the light reflectance versus wavelength.

FIG. 12 is a graph of the deviations of light transmittance versus wavelength. FIG. 13 is a graph of the light transmittance versus wavelength. FIG. 14 is a graph of the light reflectance versus wavelength. In the graphs shown in FIGS. 12 to 14, line X represents an example where the anti-reflection member AR is not disposed on the second substrate 190, whereas line Y represents an example where the anti-reflection member AR is disposed on the second substrate 190.

According to an embodiment, the line X shown in FIG. 12 shows deviations of the light transmittance of the second substrate 190 when the anti-reflection member AR is not disposed on the second substrate 190, and the line Y shows deviations of the light transmittance of the second substrate 190 and the anti-reflection member AR when the anti-reflection member AR is disposed on the second substrate 190. It can be seen from the graph of FIG. 12 that differences between the maximum value and minimum value of the light transmittance when the anti-reflection member AR is not disposed on the second substrate 190 are greater than differences between the maximum value and minimum value of the light transmittance when the anti-reflection member AR is disposed on the second substrate 190. In other words, deviations of the light transmittance when the anti-reflection member AR is not disposed on the second substrate 190 are greater than deviations of the light transmittance when the anti-reflection member AR is disposed on the second substrate 190. By disposing the anti-reflection member AR on the second substrate 190, it is possible to reduce the transmittance deviations of light passing through the second substrate 190.

Line X in the graph shown in FIG. 13 schematically shows the light transmittance of the second substrate 190 when the anti-reflection member AR is not disposed on the second substrate 190, and line Y shows the light transmittance of the second substrate 190 and the anti-reflection member AR when the anti-reflection member AR is disposed on the second substrate 190. It can be seen from the graph of FIG. 13 that the light transmittance when the anti-reflection member AR is disposed on the second substrate 190 is greater than the light transmittance when the anti-reflection member AR is not disposed on the second substrate 190. In other words, by disposing the anti-reflection member AR on the second substrate 190, it is possible to increase the transmittance of light passing through the second substrate 190.

Line X of the graph shown in FIG. 14 schematically shows the light reflectance of the second substrate 190 when the anti-reflection member AR is not disposed on the second substrate 190, and line Y shows the light reflectance of the second substrate 190 and the anti-reflection member AR when the anti-reflection member AR is disposed on the second substrate 190. It can be seen from the graph of FIG. 14 that the light reflectance when the anti-reflection member AR is disposed on the second substrate 190 is less than the light reflectance when the anti-reflection member AR is not disposed on the second substrate 190. In other words, by disposing the anti-reflection member AR on the second substrate 190, it is possible to reduce the light L2 being reflected by the optical element OPS (see FIG. 7) from being reflected again by the second substrate 190.

As a result, according to an embodiment, by disposing the anti-reflection member AR on the second substrate 190, the transmittance of the external light L1 through one or both of the first through-hole HLE_TH1 or the optical hole HLE_OP can be increased, and deviations of the light transmittance of the light L1 can be reduced. In addition, it is possible to prevent or suppress the light L2 reflected by the optical element OPS from being reflected again by the lower surface of the second substrate 190.

In addition, according to an embodiment, by disposing the anti-reflection member AR on the lower surface of the second substrate 190, it is possible to increase the efficiency of the light emitted from the active element layer ATL in the active area AAR, except for the hole area HLA.

Hereinafter, display devices according to other exemplary embodiments of the present disclosure will be described. In the following descriptions, the same or similar elements may be be denoted by the same or similar reference numerals, and redundant descriptions will be omitted or briefly described. Descriptions will focus on differences from the above exemplary embodiments.

Figure 15:
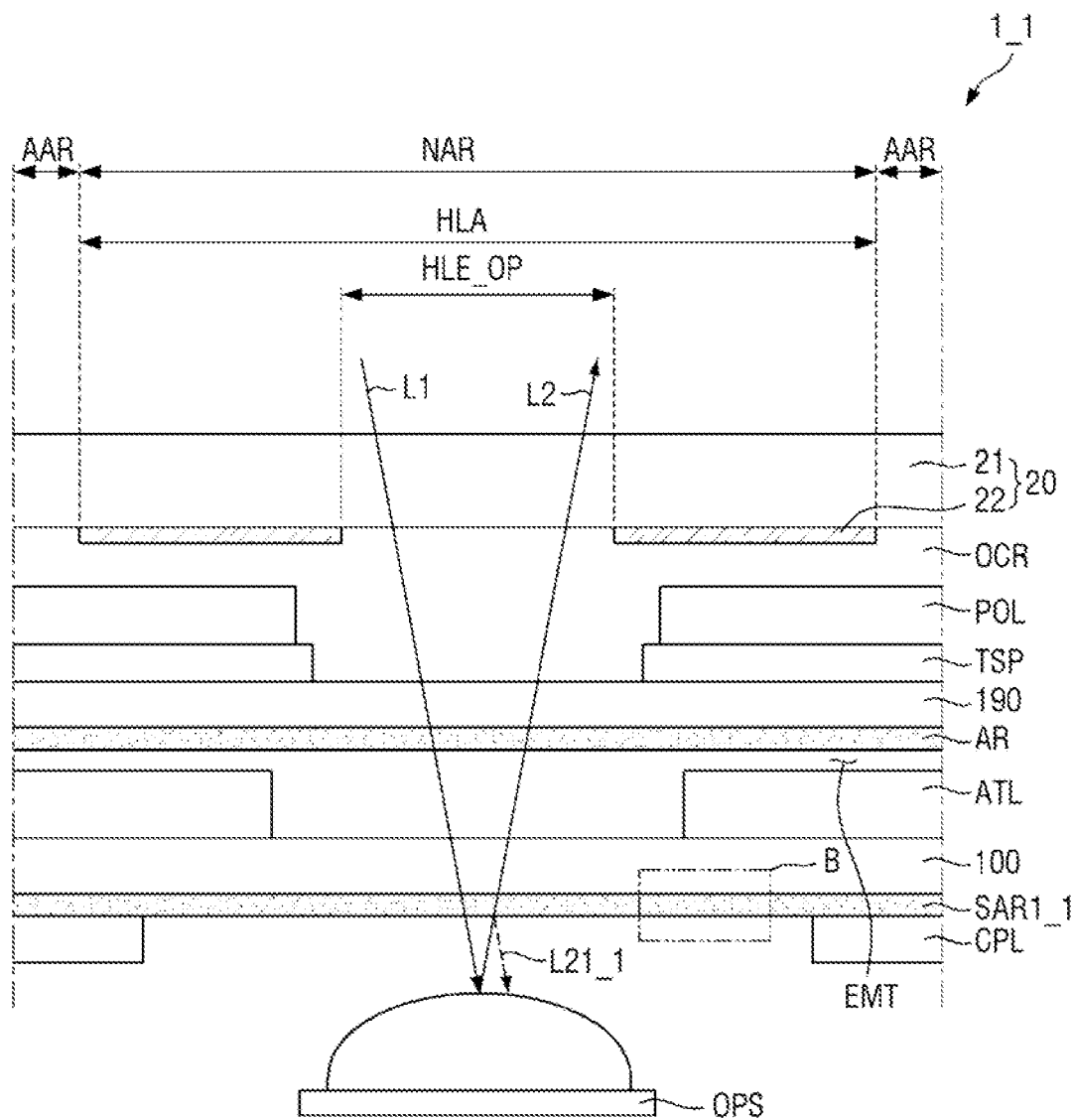
FIG. 15 is a cross-sectional view of a display device according to another exemplary embodiment of the present disclosure.
Figure 16:
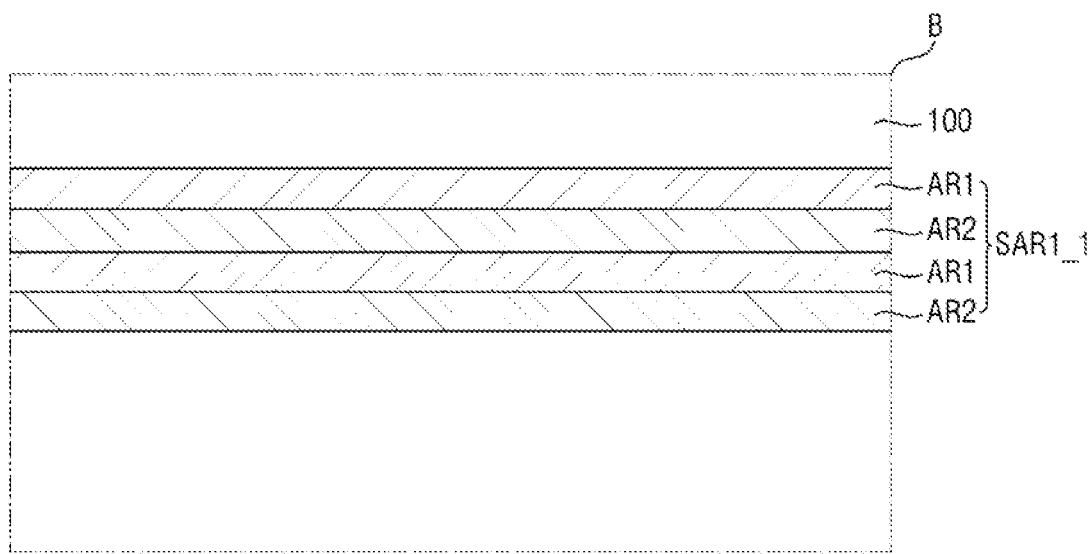
FIG. 16 is an enlarged view of area B of FIG. 15.

FIG. 15 is a cross-sectional view of a display device according to another exemplary embodiment of the present disclosure. FIG. 16 is an enlarged view of area B of FIG. 15.

According to an embodiment, a display device 1_1 according to an exemplary embodiment shown in FIGS. 15 and 16 differs from a display device according to the exemplary embodiment of FIG. 4 in that a first subsidiary anti-reflection member SAR1_1 is further disposed on the lower surface of the first substrate 100, and the cover panel CPL is disposed on a lower surface of the first subsidiary anti-reflection member SAR1_1. In other words, the first subsidiary anti-reflection member SAR1_1 is disposed between the first substrate 100 and the cover panel CPL.

Specifically, the display device 1_1 according to an exemplary embodiment further includes the first subsidiary anti-reflection member SAR1_1 in addition to the anti-reflection member AR. The first subsidiary anti-reflection member SAR1_1 is disposed on the lower surface of the first substrate 100. The first subsidiary anti-reflection member SAR1_1 includes a first refractive layer AR1 that is a high refractive index layer, and a second refractive layer AR2 that is a low refractive index layer, which are alternately disposed on the lower surface of the first substrate 100. In other words, the first refractive layer AR1 is disposed on the lower surface of the first substrate 100 in direct contact with the first substrate 100, and the second refractive layer AR2 is disposed on the lower surface of the first refractive layer AR1. Another first refractive layer AR1 is disposed on the lower surface of the second refractive layer AR2, and another second refractive layer AR2 is disposed on the lower surface of the first refractive layer AR1. The refractive index of the first refractive layers AR1 is greater than that of the first substrate 100, and the refractive index of the second refractive layers AR2 is less than or equal to that of the first substrate 100.

According to an embodiment, the first refractive layer AR1 of the anti-reflection member AR and the first refractive layer AR1 of the first subsidiary anti-reflection member SAR1_1 include the same material, and the second refractive layer AR2 of the anti-reflection member AR and the second refractive layer AR2 of the first subsidiary anti-reflection member SAR1_1 include the same material. However, embodiments of the present disclosure are not limited thereto. In other embodiments, the first refractive layer AR1 of the anti-reflection member AR and the first refractive layer AR1 of the first subsidiary anti-reflection member SAR1_1 may include different materials, and the second refractive layer AR2 of the anti-reflection member AR and the second refractive layer AR2 of the first subsidiary anti-reflection member SAR1_1 may include different materials.

In an embodiment, it is possible to suppress or prevent the reflected light L2 that is reflected by the optical element OPS from being reflected again at the lower surface of the first substrate 100. Accordingly, the first subsidiary anti-reflection member SAR1_1 can suppress or prevent the light L21_1 that is reflected by the lower surface of the first substrate 100 from reinforcing or interfering with the external light L1, thereby reducing deviations of the light transmittance. In addition, by suppressing or preventing the light L21_1 that is reflected by the lower surface of the first substrate 100 from being incident on the optical element OPS again, it is possible to suppress or prevent the flare phenomenon in the optical element OPS.

In an embodiment, the light transmittance at the interface between the first substrate 100 and the second substrate 190 can be increased by the first subsidiary anti-reflection member SAR1_1 as well as the anti-reflection member AR. Accordingly, the deviations of light transmittance can be reduced, and the flare phenomenon of the optical element OPS can be suppressed or prevented. Therefore, the optical element OPS and the display device 1_1 that includes it can be operated more efficiently.

Figure 17:
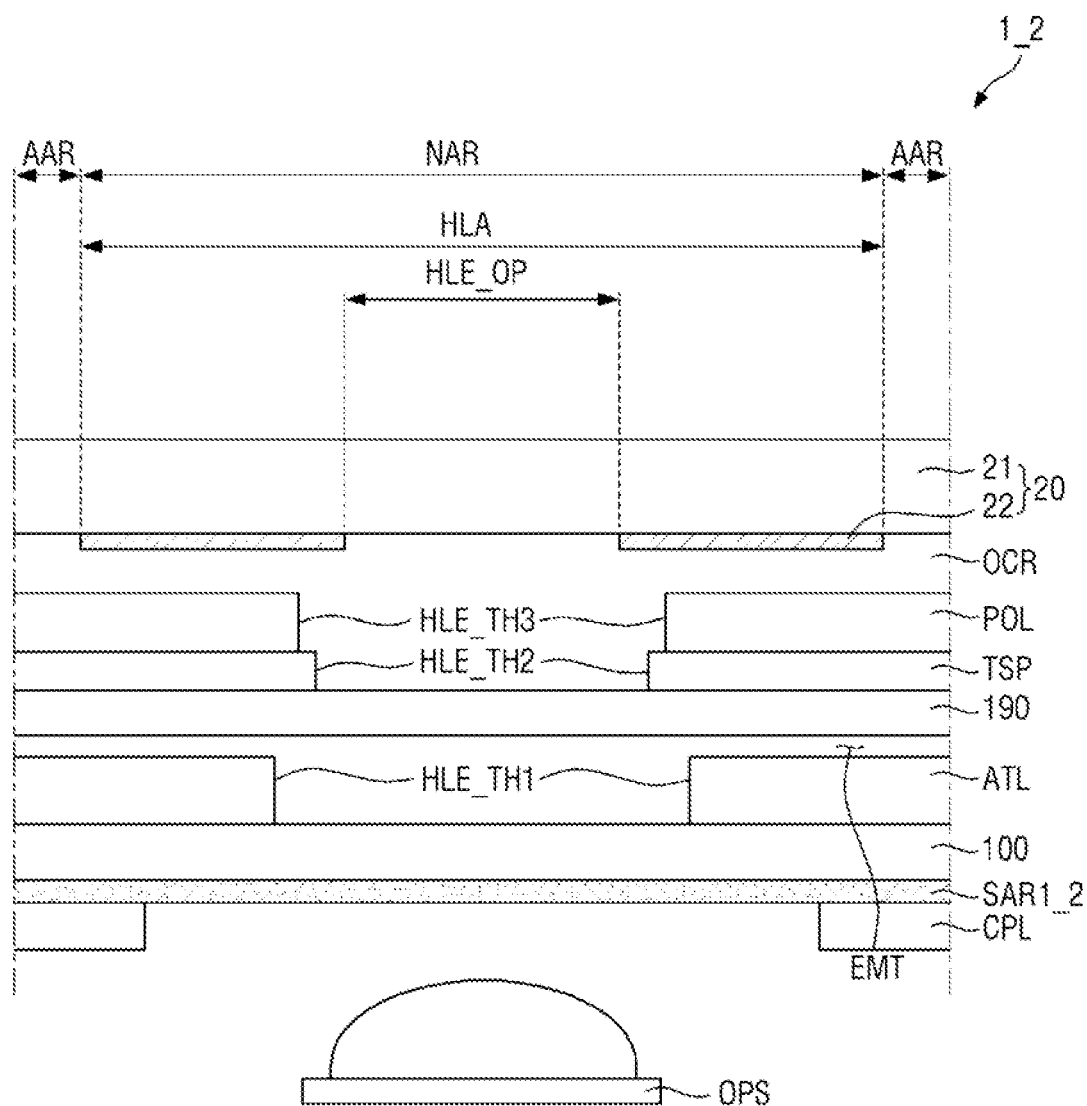
FIG. 17 is a cross-sectional view of a display device according to yet another exemplary embodiment of the present disclosure.

FIG. 17 is a cross-sectional view of a display device according to yet another exemplary embodiment of the present disclosure.

A display device 1_2 according to an exemplary embodiment shown in FIG. 17 differs from the display device according to an exemplary embodiment of FIG. 15 in that the display device 1_2 does not include the anti-reflection member AR, but does include a first subsidiary anti-reflection member SAR1_2.

Specifically, the display device 1_2 according to an exemplary embodiment does not include the anti-reflection member AR disposed on the lower surface of the second substrate 190 but does include the first subsidiary anti-reflection member SAR1_2 disposed on the lower surface of the first substrate 100.

Also, in an embodiment, the light transmittance can be increased by the first subsidiary anti-reflection member SAR1_2. Accordingly, deviations of light transmittance can be reduced, and the flare phenomenon of the optical element OPS can be suppressed or prevented. Therefore, the optical element OPS and the display device 1_2 that includes it can be operated more efficiently.

Figure 18:
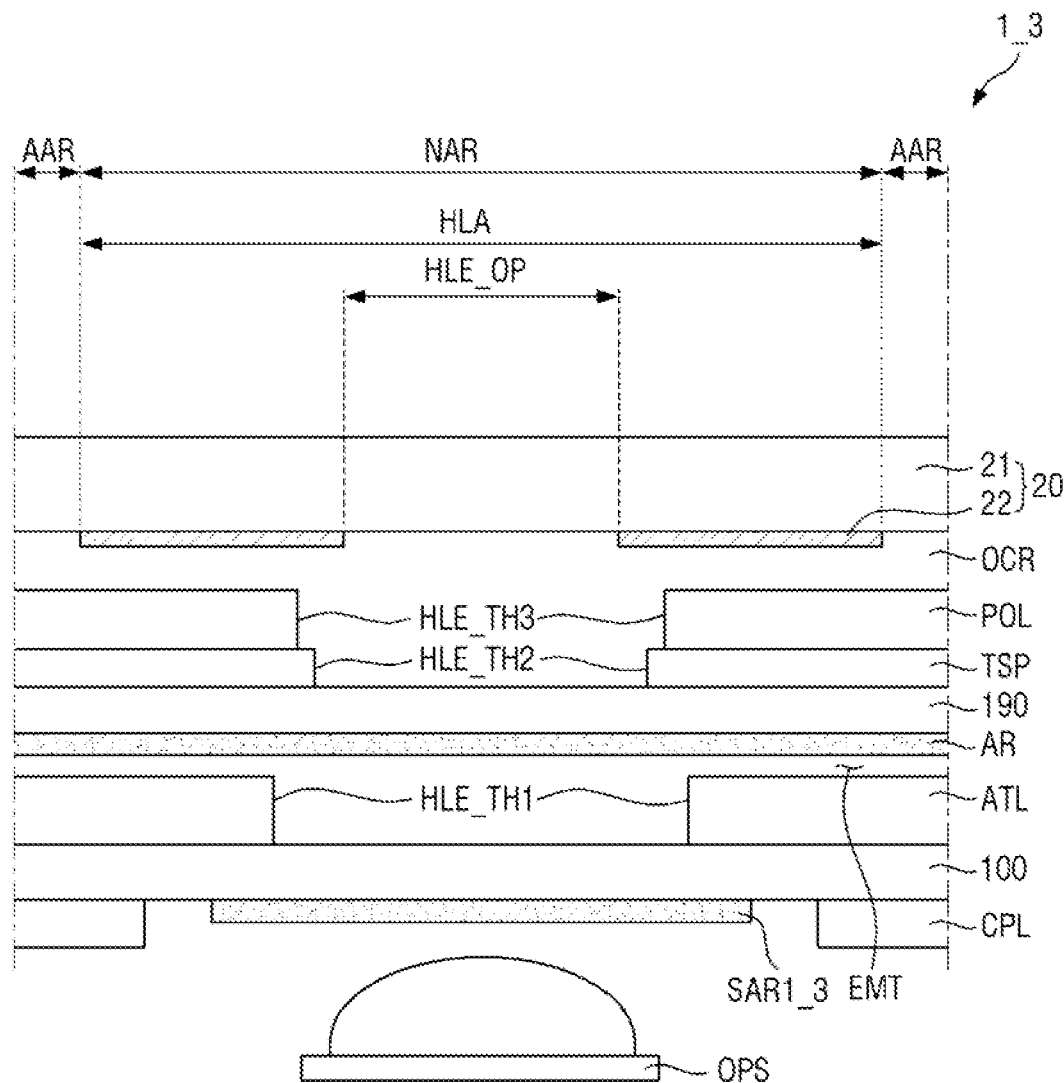
FIG. 18 is a cross-sectional view of a display device according to yet another exemplary embodiment of the present disclosure.

FIG. 18 is a cross-sectional view of a display device according to yet another exemplary embodiment of the present disclosure.

A display device 1_3 according to an exemplary embodiment shown in FIG. 18 differs from the display device according to an exemplary embodiment of FIG. 15 in that a first subsidiary anti-reflection member SAR1_3 is disposed on a part of the lower surface of the first substrate 100.

Specifically, the display device 1_3 according to an exemplary embodiment includes the anti-reflection member AR disposed on the lower surface of the second substrate 190, and includes the first subsidiary anti-reflection member SAR1_3 disposed on the lower surface of the first substrate 100, and the first subsidiary anti-reflection member SAR1_3 is disposed on a part of the lower surface of the first substrate 100. The first subsidiary anti-reflection member SAR1_3 overlaps with at least one of the optical hole HLE_OP or the first through-hole HLE_TH1. The first subsidiary anti-reflection member SAR1_3 is disposed in an area where the cover panel CPL is not disposed, and is surrounded by the cover panel CPL.

Also, in an embodiment, the light transmittance at the interface between the first substrate 100 and the second substrate 190 can be increased by the first subsidiary anti-reflection member SAR1_3 as well as the anti-reflection member AR. Accordingly, deviations of light transmittance can be reduced, and the flare phenomenon of the optical element OPS can be suppressed or prevented. Therefore, the optical element OPS and the display device 1_3 that includes it can be operated more efficiently.

Figure 19:
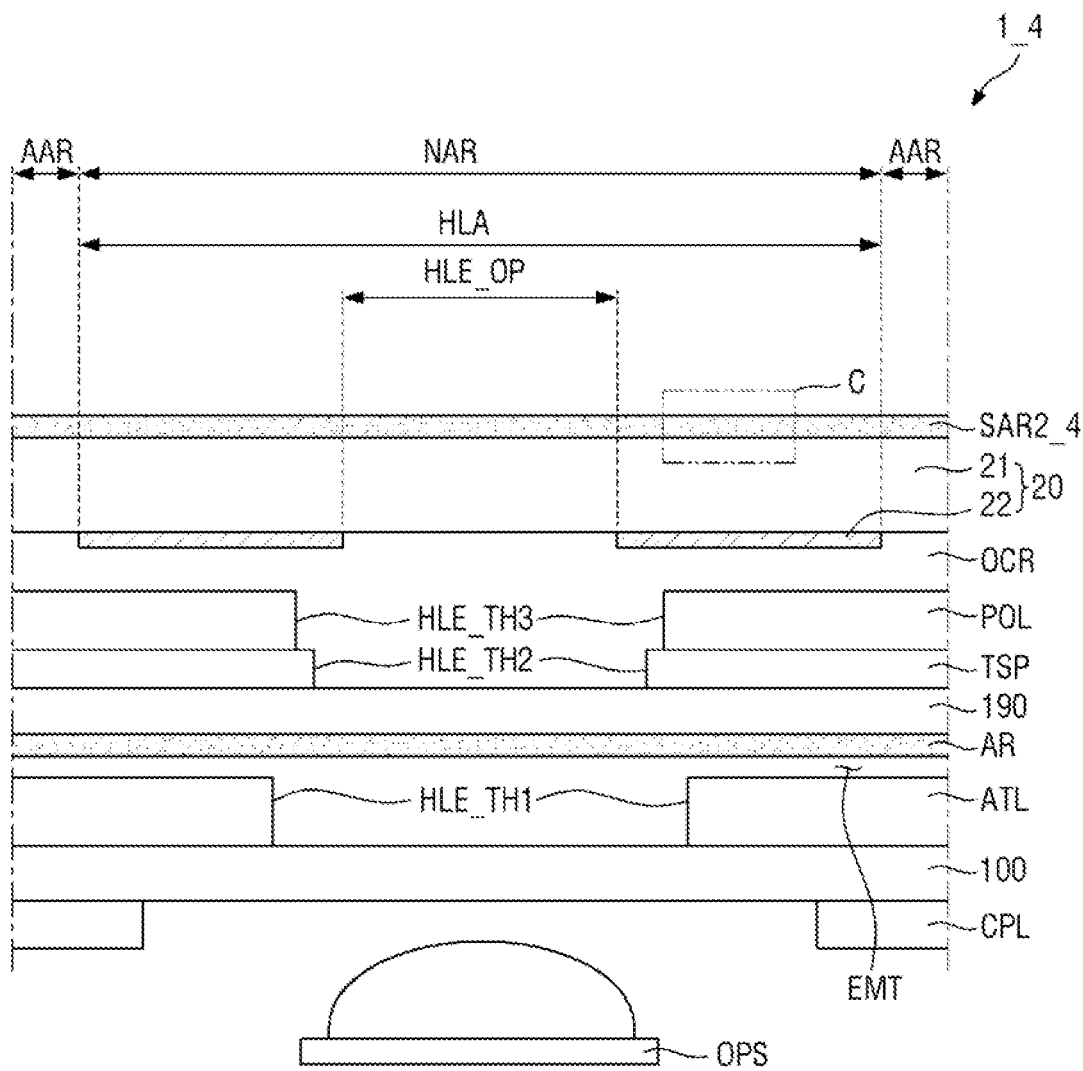
FIG. 19 is a cross-sectional view of a display device according to yet another exemplary embodiment of the present disclosure.
Figure 20:
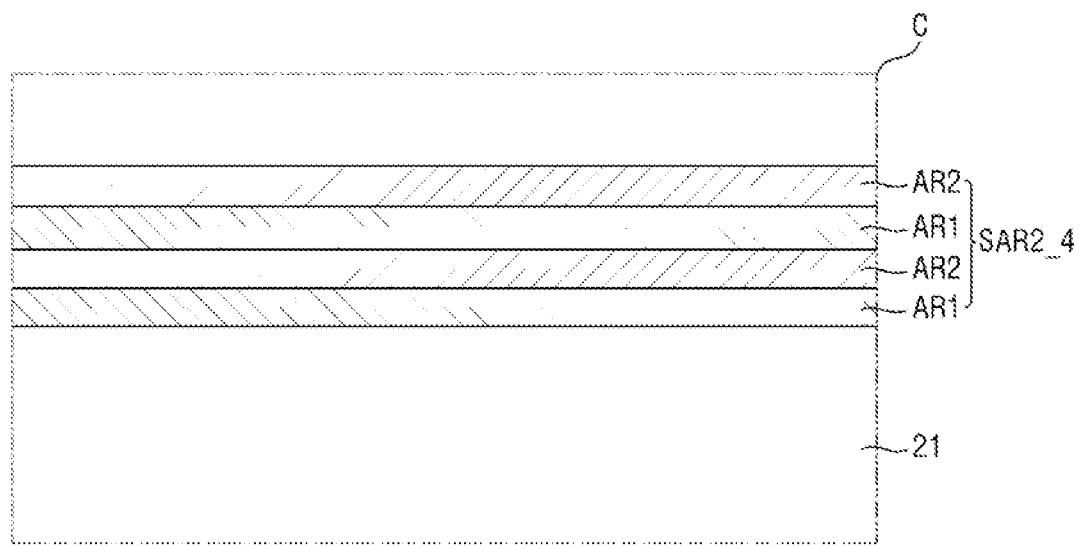
FIG. 20 is an enlarged view of area C of FIG. 19.

FIG. 19 is a cross-sectional view of a display device according to yet another exemplary embodiment of the present disclosure. FIG. 20 is an enlarged view of area C of FIG. 19.

A display device 1_4 according to the exemplary embodiment shown in FIGS. 19 and 20 is different from the display device according to the exemplary embodiment of FIG. 4 in that the display device 1_4 further includes a second subsidiary anti-reflection member SAR2_4.

Specifically, the display device 14 according to an exemplary embodiment further includes the second subsidiary anti-reflection member SAR2_4 in addition to the anti-reflection member AR. The second subsidiary anti-reflection member SAR2_4 is disposed on the window substrate 21 of the window member 20. The second subsidiary anti-reflection member SAR2_4 is disposed on the upper surface of the window substrate 21. In other words, the second subsidiary anti-reflection member SAR2_4 is disposed on an outer side of the display device 14.

According to an embodiment, the second subsidiary anti-reflection member SAR2_4 includes a first refractive layer AR1 that is a high refractive index layer, and a second refractive layer AR2 that is a low refractive index layer, which are alternately disposed on the upper surface of the window substrate 21. In other words, the first refractive layer AR1 is disposed on the upper surface of the window substrate 21 in direct contact with the window substrate 21, and the second refractive layer AR2 is disposed on the upper surface of the first refractive layer AR1. Another first refractive layer AR1 is disposed on the upper surface of the second refractive layer AR2, and another second refractive layer AR2 is disposed on the upper surface of the first refractive layer AR1. The refractive index of the first refractive layers AR1 is greater than that of the window substrate 21, and the refractive index of the second refractive layers AR2 is less than or equal to that of the window substrate 21. As the second subsidiary anti-reflection member SAR2_4 is disposed on an upper surface of the window substrate 21, the amount of external light that passes through the window substrate 21 increases, and the amount of the light reaching the optical element OPS can be increased. That is to say, the light transmittance of the optical hole HLE_OP can be improved.

According to an embodiment, the first refractive layer AR1 of the anti-reflection member AR and the first refractive layer AR1 of the second subsidiary anti-reflection member SAR2_4 include the same material, and the second refractive layer AR2 of the anti-reflection member AR and the second refractive layer AR2 of the second subsidiary anti-reflection member SAR2_4 include the same materials. However, embodiments of the present disclosure are not limited thereto. In other embodiments, the first refractive layer AR1 of the anti-reflection member AR and the first refractive layer AR1 of the second subsidiary anti-reflection member SAR2_4 include different materials, and the second refractive layer AR2 of the anti-reflection member AR and the second refractive layer AR2 of the second subsidiary anti-reflection member SAR2_4 include different materials.

Also, in an embodiment, the light transmittance at the interface of the second substrate 190 can be increased by the anti-reflection member AR. Accordingly, deviations of light transmittance can be reduced, and the flare phenomenon of the optical element OPS can be suppressed or prevented. Therefore, the optical element OPS and the display device 1_4 that includes it can be operated more efficiently.

Figure 21:
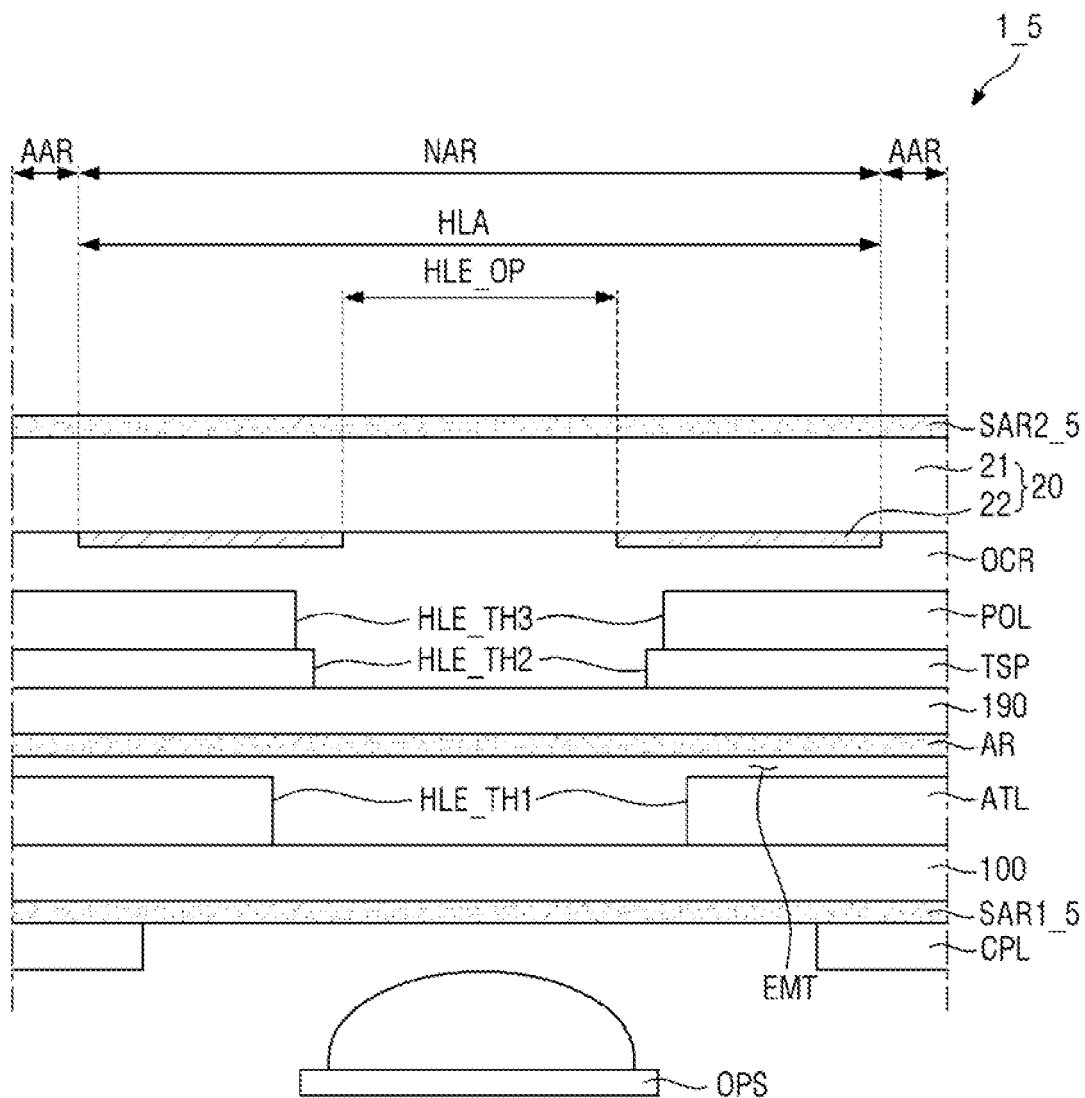
FIG. 21 is a cross-sectional view of a display device according to yet another exemplary embodiment of the present disclosure.

FIG. 21 is a cross-sectional view of a display device according to yet another exemplary embodiment of the present disclosure.

A display device 1_5 according to an exemplary embodiment shown in FIG. 21 differs from a display device 1_4 according to an exemplary embodiment of FIG. 19 in that the display device 1_5 further includes a first subsidiary anti-reflection member SAR1_5 in addition to an anti-reflection member AR and a second subsidiary anti-reflection member SAR2_5. Although the first subsidiary anti-reflection member SAR1_5 of FIG. 21 has substantially the same configuration as the first subsidiary anti-reflection members SAR1_1 and SAR1_2 of FIGS. 15 to 17, the first subsidiary anti-reflection member SAR1_5 may also have the same configuration as the first subsidiary anti-reflection member SAR1_3 of FIG. 18.

Specifically, in the display device 1_5 according to an exemplary embodiment, the anti-reflection member AR is disposed on the lower surface of the second substrate 190, the first subsidiary anti-reflection member SAR1_5 is disposed on the lower surface of the first substrate 100, and the second subsidiary anti-reflection member SAR2_5 is disposed on the upper surface of the window substrate 21.

In such case, according to an embodiment, light transmittance can be improved by the anti-reflection member AR, the first subsidiary antireflection member SAR1_5, and the second subsidiary anti-reflection member SAR2_5. In addition, deviations of light transmittance can be reduced, and the flare phenomenon of the optical element OPS can be suppressed or prevented. Therefore, the optical element OPS and the display device 1_5 that includes it can be operated more efficiently.

Figure 22:
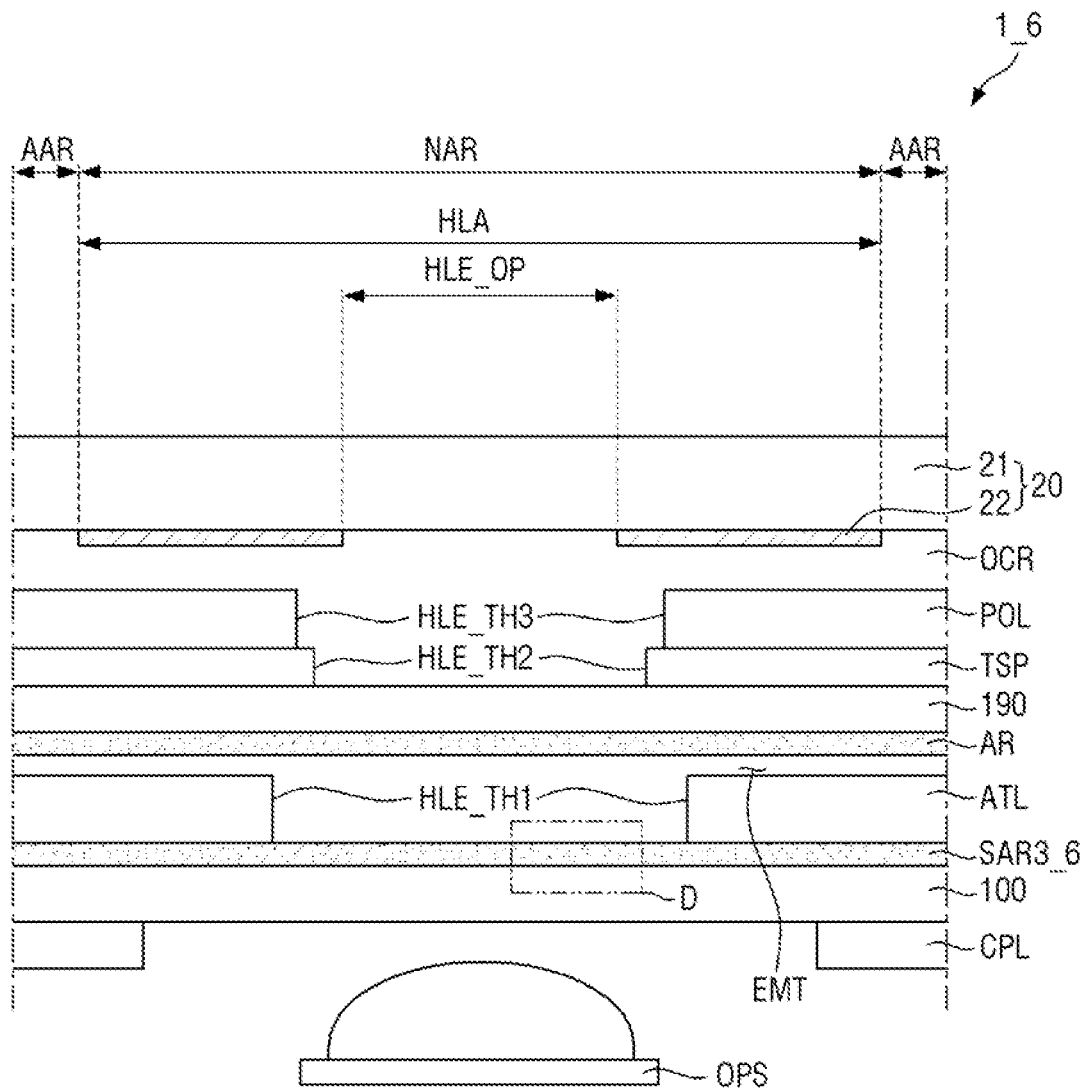
FIG. 22 is a cross-sectional view of a display device according to yet another exemplary embodiment of the present disclosure.
Figure 23:
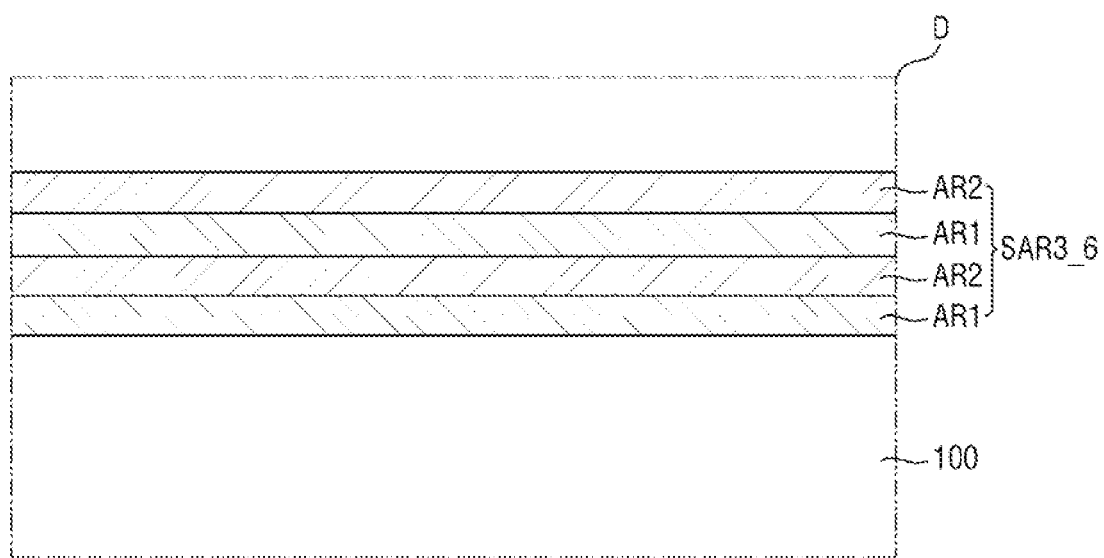
FIG. 23 is an enlarged view of portion D of FIG. 22.

FIG. 22 is a cross-sectional view of a display device according to yet another exemplary embodiment of the present disclosure. FIG. 23 is an enlarged view of portion D of FIG. 22.

A display device 1_6 according to an exemplary embodiment shown in FIGS. 22 and 23 differs from a display device according to an exemplary embodiment of FIG. 4 in that the display device 1_6 further includes a third subsidiary anti-reflection member SAR3_6.

Specifically, the display device 1_6 according to an exemplary embodiment includes the anti-reflection member AR disposed on the lower surface of the second substrate 190 and further includes a third subsidiary anti-reflection member SAR3_6 disposed on the upper surface of the first substrate 100.

According to an embodiment, the third subsidiary anti-reflection member SAR3_6 is disposed on the upper surface of the first substrate 100, is spaced apart from the anti-reflection member AR and faces the anti-reflection member AR with the vacuum area EMT therebetween. The active element layer ATL is disposed on an upper surface of the third subsidiary anti-reflection member SAR3_6. In other words, the third subsidiary anti-reflection member SAR3_6 is disposed between the first substrate 100 and the active element layer ATL. The third subsidiary anti-reflection member SAR3_6 is formed on the first substrate 100 before the active element layer ATL is formed. However, embodiments of the present disclosure are not limited thereto, and in other embodiments, the method of disposing the third subsidiary anti-reflection member SAR3_6 on the first substrate 100 can vary.

According to an embodiment, the third subsidiary anti-reflection member SAR3_6 includes a first refractive layer AR1 that is a high refractive index layer, and a second refractive layer AR2 that is a low refractive index layer, which are alternately disposed on the upper surface of the first substrate 100. In other words, the first refractive layer AR1 is disposed on the upper surface of the first substrate 100 in direct contact with the first substrate 100, and the second refractive layer AR2 is disposed on the upper surface of the first refractive layer AR1. Another first refractive layer AR1 is disposed on the upper surface of the second refractive layer AR2, and another second refractive layer AR2 is disposed on the upper surface of the first refractive layer AR1. The refractive index of the first refractive layers AR1 is greater than that of the first substrate 100, and the refractive index of the second refractive layers AR2 is less than or equal to that of the first substrate 100. Since the third subsidiary anti-reflection member SAR3_6 is disposed on the upper surface of the first substrate 100, the amount of external light that passes through the first substrate 100 can be increased, and the amount of the light that reaches the optical element OPS can be increased. That is to say, the light transmittance at the optical hole HLE_OP can be improved.

According to an embodiment, the first refractive layer AR1 of the anti-reflection member AR and the first refractive layer AR1 of the third subsidiary anti-reflection member SAR3_6 include the same material, and the second refractive layer AR2 of the anti-reflection member AR and the second refractive layer AR2 of the third subsidiary anti-reflection member SAR3_6 include the same material. Embodiments of the present disclosure are not limited thereto. In other embodiments, the first refractive layer AR1 of the anti-reflection member AR and the first refractive layer AR1 of the third subsidiary anti-reflection member SAR3_6 include different materials, and the second refractive layer AR2 of the anti-reflection member AR and the second refractive layer AR2 of the third subsidiary anti-reflection member SAR3_6 include different materials.

Also, in an embodiment, the light transmittance at the interface of the second substrate 190 can be increased by the anti-reflection member AR. Accordingly, deviations of light transmittance can be reduced, and the flare phenomenon of the optical element OPS can be suppressed or prevented. Therefore, the optical element OPS and the display device 1_6 that includes it can be operated more efficiently.

Figure 24:
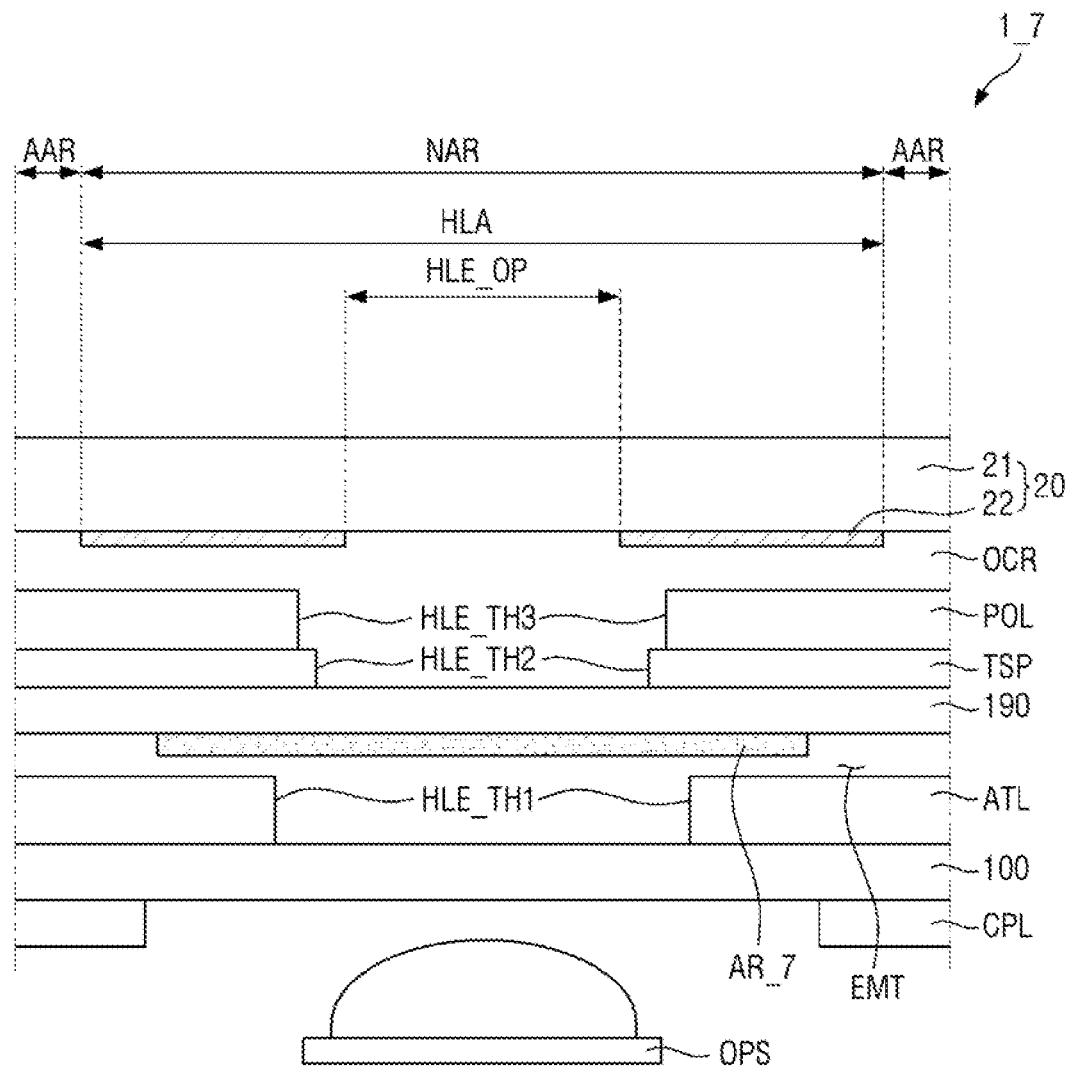
FIG. 24 is a cross-sectional view of a display device according to yet another exemplary embodiment of the present disclosure.

FIG. 24 is a cross-sectional view of a display device according to yet another exemplary embodiment of the present disclosure.

A display device 1_7 according to an exemplary embodiment shown in FIG. 24 differs from a display device according to an exemplary embodiment of FIG. 4 in that an anti-reflection member AR_7 is disposed only on a part of the lower surface of the second substrate 190.

Specifically, the display device 1_7 according to an exemplary embodiment includes the anti-reflection member AR_7 that is not disposed on the whole lower surface of the second substrate 190 but is disposed on a part of the lower surface of the second substrate 190. That is to say, the anti-reflection member AR_7 is disposed in the hole area HLA but not the active area AAR, and overlaps the hole area HLA. The anti-reflection member AR_7 completely overlaps at least the first through-hole HLE_TH1, although embodiments are not limited thereto.

Also, in an embodiment, the light transmittance at the interface of the second substrate 190 can be increased in the hole area HLA. Accordingly, deviations of light transmittance can be reduced, and the flare phenomenon of the optical element OPS can be suppressed or prevented. Therefore, the optical element OPS and the display device 1_7 that includes it can be operated more efficiently.

In concluding the detailed description, those skilled in the art will appreciate that many variations and modifications can be made to exemplary embodiments without substantially departing from the principles of embodiments of the present disclosure. Therefore, exemplary embodiments of the disclosure are used in a generic and descriptive. sense only and not for purposes of limitation.

What is claimed is:

1. A display device, comprising:
a first substrate;
a second substrate that faces the first substrate;
an active element layer disposed on a first surface of the first substrate that faces the second substrate and that includes a first through-hole that penetrates therethrough in a thickness direction; and
an anti-reflection member disposed on a second surface of the second substrate that faces the first substrate, overlaps the first through-hole, and is spaced apart from the first through-hole,
wherein the anti-reflection member comprises:
a first refractive layer disposed on the second surface of the second substrate and that has a refractive index greater than a refractive index of the second substrate, and
a second refractive layer disposed on the first refractive layer and that has a refractive index less than the refractive index of the first refractive layer.

2. The display device of claim 1, further comprising an empty space filled with a vacuum or a gas interposed between the anti-reflection member and the active element layer, wherein the empty space overlaps the first through-hole.

3. The display device of claim 1, wherein the refractive index of the second substrate is greater than or equal to the refractive index of the second refractive layer.

4. The display device of claim 1, further comprising:
a first subsidiary anti-reflection member disposed on a second surface of the first substrate, wherein the first subsidiary anti-reflection member includes a first refractive layer and a second refractive layer that have different refractive indexes,
wherein a refractive index of the first refractive layer of the first subsidiary anti-reflection member is greater than a refractive index of the first substrate, and
wherein the refractive index of the first substrate is greater than or equal to a refractive index of the second refractive layer of the first subsidiary anti-reflection member.

5. The display device of claim 4, wherein the first subsidiary anti-reflection member is disposed in an area that overlaps the first through-hole.

6. The display device of claim 1, further comprising:
a second subsidiary anti-reflection member disposed between the first substrate and the active element layer,
wherein the second subsidiary anti-reflection member includes a first refractive layer and a second refractive layer that have different refractive indexes,
wherein a refractive index of the first refractive layer of the second subsidiary anti-reflection member is greater than a refractive index of the first substrate, and
wherein the refractive index of the first substrate is greater than or equal to a refractive index of the second refractive layer of the second subsidiary anti-reflection member.

7. The display device of claim 1, further comprising:
an active area and a non-active area, wherein the first through-hole is formed inside the active area and is surrounded by the active area, wherein the first through-hole is formed in the non-active area.

8. The display device of claim 1, further comprising:
a polarizer disposed on a first surface of the second substrate, wherein the polarizer includes a second through-hole that penetrates therethrough in the thickness direction and that overlaps the first through-hole, and wherein the second through-hole is filled with a transparent resin.

9. The display device of claim 8, further comprising:
a window member disposed on a first surface of the polarizer,
wherein the window member includes a window substrate and a print layer disposed on the window substrate and that overlaps the first through-hole and at least partially exposes the first through-hole.

10. The display device of claim 9, further comprising:
a touch member disposed between the second substrate and the polarizer,
wherein the touch member includes a third through-hole that penetrates therethrough in the thickness direction and that overlaps at least one of the first through-hole and the second through-hole, and
wherein the third through-hole is filled with a transparent resin.

11. The display device of claim 9, further comprising:
a third subsidiary anti-reflection member disposed on the window member, wherein the third subsidiary anti-reflection member includes a first refractive layer and a second refractive layer that have different refractive indexes,
wherein a refractive index of the first refractive layer of the third subsidiary anti-reflection member is greater than a refractive index of the window substrate, and
wherein the refractive index of the window substrate is greater than or equal to a refractive index of the second refractive layer of the third subsidiary anti-reflection member.

12. The display device of claim 1, wherein the first refractive layer comprises at least one of silicon nitride (SiNx), aluminum oxide (AlOx), titanium oxide (TiOx) or niobium oxide ($Nb_2O_5$), and wherein the second refractive layer comprises silicon ($SiO_2$).

13. A display device, comprising:
a display panel that includes a first substrate, a second substrate that faces the first substrate, an active element layer disposed on the first substrate, and an anti-reflection member disposed on the second substrate;
a hole area formed in a display area of the display panel;
a polarizer disposed on the display panel; and
a window member disposed on the polarizer and that includes a window substrate and a print layer disposed on the window substrate, wherein the hole area comprises
a first through-hole that penetrates the active element layer in a thickness direction,
a second through-hole that overlaps the first through-hole and penetrates the polarizer in the thickness direction, and
an optical hole surrounded by the print layer, wherein the optical hole overlaps the first through-hole and the second through-hole, and
wherein the anti-reflection member is spaced apart from the first through-hole, and overlaps the first through-hole and the second through-hole.

14. The display device of claim 13, wherein the anti-reflection member includes a first refractive layer disposed on a second surface of the second substrate and that has a refractive index greater than a refractive index of the second substrate, and a second refractive layer disposed on the first refractive layer and that has a refractive index less than the refractive index of the first refractive layer, wherein the refractive index of the second substrate is greater than or equal to the refractive index of the second refractive layer.

15. The display device of claim 14, wherein the first refractive layer comprises at least one of silicon nitride (SiNx), aluminum oxide (AlOx), titanium oxide (TiOx) or niobium oxide ($Nb_2O_5$), and wherein the second refractive layer comprises silicon ($SiO_2$).

16. The display device of claim 13, further comprising:
a first subsidiary anti-reflection member disposed on the first substrate,
wherein the first subsidiary anti-reflection member includes a first refractive layer and a second refractive layer that have different refractive indexes,
wherein a refractive index of the first refractive layer of the first subsidiary anti-reflection member is greater than a refractive index of the first substrate, and
wherein the refractive index of the first substrate is greater than or equal to a refractive index of the second refractive layer of the first subsidiary anti-reflection member.

17. The display device of claim 16, further comprising:
a second subsidiary anti-reflection member disposed on the window member,
wherein the second subsidiary anti-reflection member includes a first refractive layer and a second refractive layer that have different refractive indexes,
wherein a refractive index of the first refractive layer of the second subsidiary anti-reflection member is greater than a refractive index of the window substrate, and
wherein the refractive index of the window substrate is greater than or equal to a refractive index of the second refractive layer of the second subsidiary anti-reflection member.

18. A display device, comprising:
a first substrate;
a second substrate that faces the first substrate;
an active element layer disposed on a first surface of the first substrate that faces the second substrate;
a first through-hole that penetrates the in a thickness direction; and
an anti-reflection member disposed on one or both of the first substrate or the second substrate, wherein the anti-reflection member overlaps the first through-hole,
wherein the anti-reflection member comprises:
a first refractive layer disposed on the first substrate or the second substrate and that has a refractive index greater than a refractive index of first substrate or the second substrate, and
a second refractive layer disposed on the first refractive layer and that has a refractive index less than the refractive index of the first refractive layer, wherein the first refractive layer is disposed between the second refractive layer and the first substrate or the second substrate.

19. The display device of claim 18, further comprising:
a polarizer disposed on a surface of the second substrate opposite from the first substrate, wherein the polarizer includes a second through-hole that penetrates therethrough in the thickness direction and that overlaps the first through-hole;
a window member disposed on a first surface of the polarizer, wherein the window member includes a window substrate and a print layer disposed on the window substrate and that overlaps the first through-hole and at least partially exposes the first through-hole; and
a touch member disposed between the second substrate and the polarizer, wherein the touch member includes a third through-hole that penetrates therethrough in the thickness direction and that overlaps at least one of the first through-hole and the second through-hole.

20. The display device of claim 19, further comprising:
a subsidiary anti-reflection member disposed on the window member, wherein the subsidiary anti-reflection member includes a first refractive layer and a second refractive layer that have different refractive indexes,
wherein a refractive index of the first refractive layer of the subsidiary anti-reflection member is greater than a refractive index of the window substrate, and
wherein the refractive index of the window substrate is greater than or equal to a refractive index of the second refractive layer of the subsidiary anti-reflection member.

* * * * *